(12) United States Patent
Mochida et al.

(10) Patent No.: US 6,964,093 B2
(45) Date of Patent: Nov. 15, 2005

(54) SYSTEM FOR MOUNTING ELECTRONIC DEVICE

(75) Inventors: Kazuhisa Mochida, Saitama (JP); Katsumi Togasaki, Saitama (JP); Katsumi Morita, Saitama (JP); Yusuke Masutani, Saitama (JP); Hiroji Kameda, Saitama (JP); Noboru Sekiguchi, Saitama (JP); Minoru Shimada, Saitama (JP); Toshio Toyama, Saitama (JP); Akihiro Koga, Saitama (JP); Mitsuo Inoue, Saitama (JP); Kazuhiro Abe, Saitama (JP); Tetsuya Yonemoto, Saitama (JP); Kenji Ishihara, Saitama (JP); Syunji Aoki, Saitama (JP); Fumio Matsumoto, Saitama (JP); Takanori Arai, Saitama (JP); Hisashi Naoshima, Saitama (JP)

(73) Assignee: Sony Corporation, Tokyo (JP)

( * ) Notice: Subject to any disclaimer, the term of this patent is extended or adjusted under 35 U.S.C. 154(b) by 488 days.

(21) Appl. No.: 10/030,293

(22) PCT Filed: Apr. 26, 2001

(86) PCT No.: PCT/JP01/03654

§ 371 (c)(1),
(2), (4) Date: Apr. 12, 2002

(87) PCT Pub. No.: WO01/84895

PCT Pub. Date: Nov. 8, 2001

(65) Prior Publication Data

US 2002/0133937 A1    Sep. 26, 2002

(30) Foreign Application Priority Data

Apr. 27, 2000 (JP) .............................. 2000-13293

(51) Int. Cl.$^7$ .......................... H05K 3/34; B23K 31/02
(52) U.S. Cl. .......................... 29/742; 29/740; 29/741; 29/744; 29/834; 29/840; 228/180.22; 228/39
(58) Field of Search .......................... 29/740–742, 744, 29/831, 834, 840, 843; 228/8, 10, 33, 39, 228/180.22, 102, 103, 245–262, 44.7, 49.5

(56) References Cited

U.S. PATENT DOCUMENTS

| | | | | |
|---|---|---|---|---|
| 4,386,464 A | * | 6/1983 | Yanai et al. | 29/834 |
| 5,443,534 A | * | 8/1995 | Vinciarelli et al. | 29/593 |
| 5,564,183 A | * | 10/1996 | Satou et al. | 29/840 |
| 5,659,947 A | * | 8/1997 | Eilers et al. | 29/740 |
| 6,295,728 B1 | * | 10/2001 | Shin et al. | 29/840 |

* cited by examiner

Primary Examiner—A. Dexter Tugbang
Assistant Examiner—Terri Lynn Smith
(74) Attorney, Agent, or Firm—Jay H. Maioli

(57) ABSTRACT

An electronics packaging system (1) including a printer (3), a placing unit (4) and a reflow unit (5), wherein a printed wiring board (2) is carried while being kept in an upright position. The printed wiring board (2) has solder printed on all the lands thereof at the same time, the electronic parts (10) are all placed on the lands at the same time, and the electronic parts (10) are all soldered to the lands at the same time. Thus, the system (1) can be designed more compact, and the electronic parts packaged in a shorter time.

2 Claims, 27 Drawing Sheets

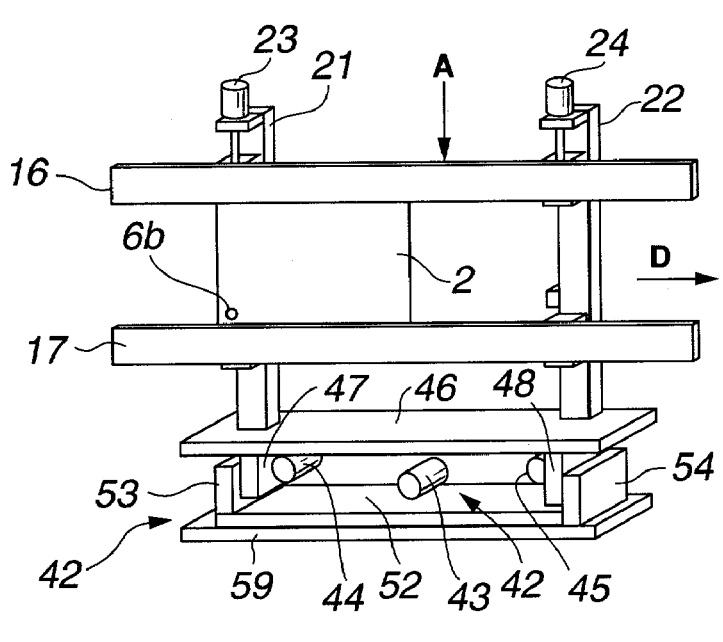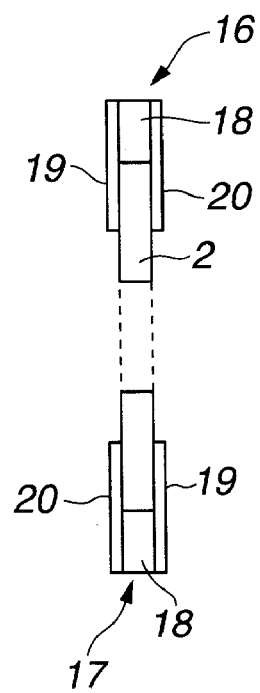
FIG.4A  FIG.4B
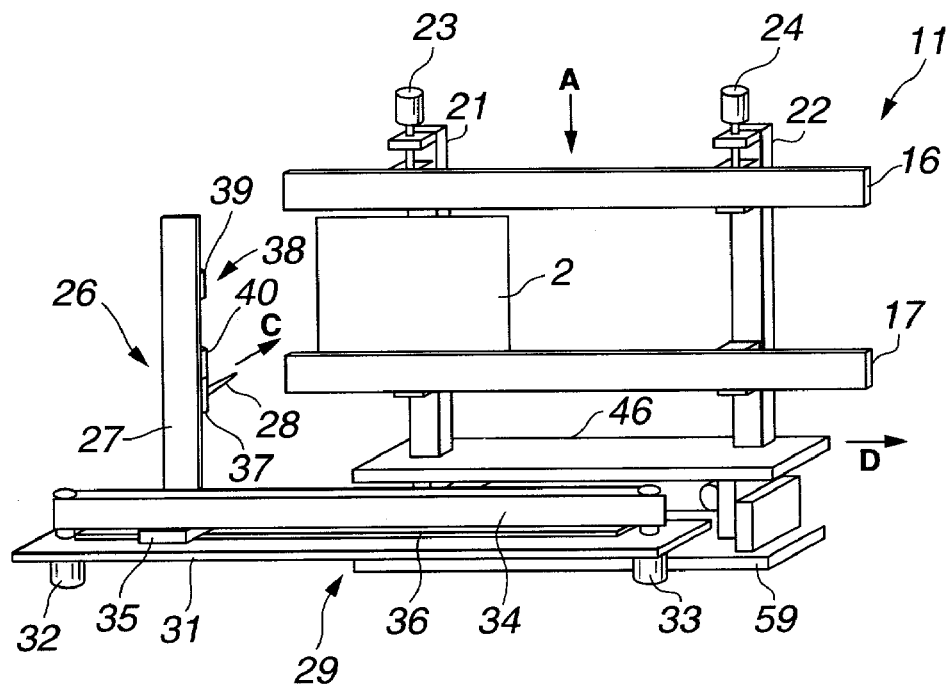
FIG.5

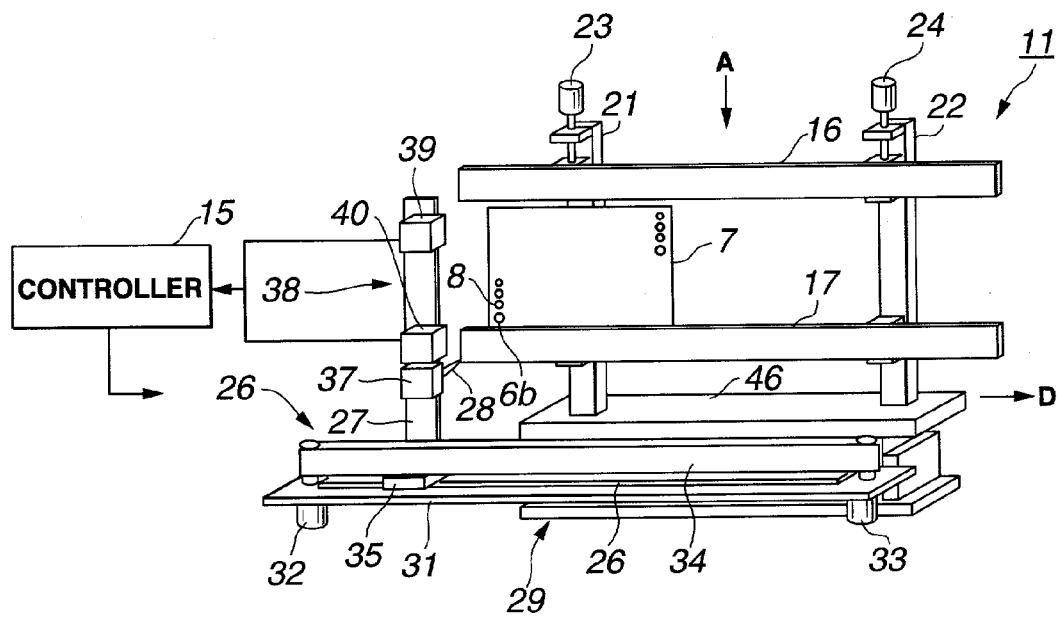
FIG. 6
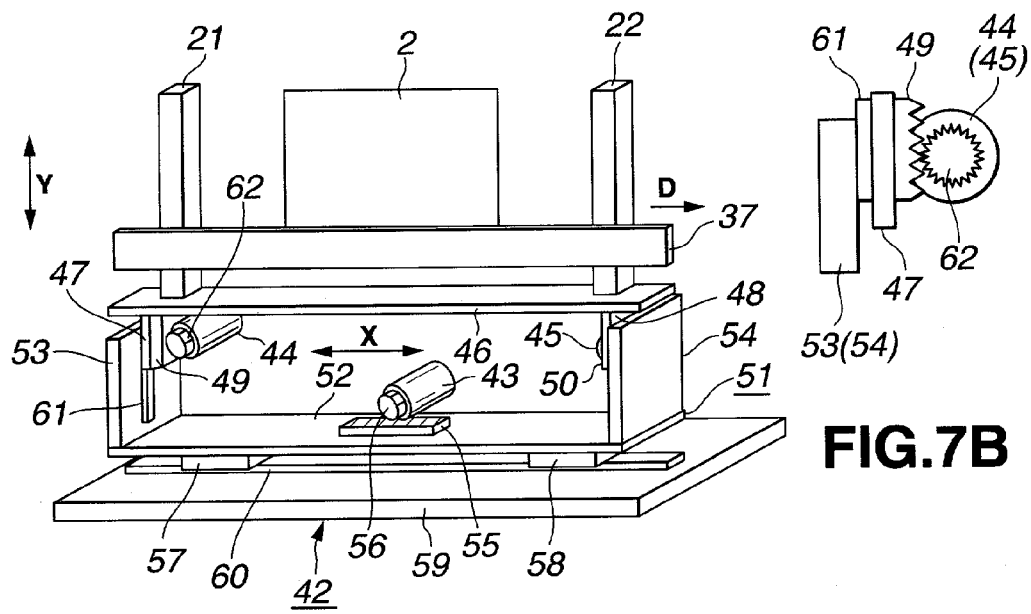
FIG. 7A
FIG. 7B

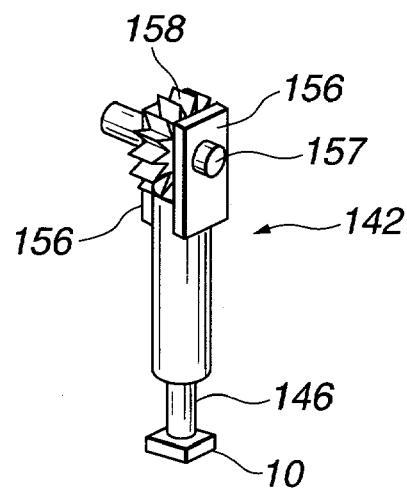
FIG.25
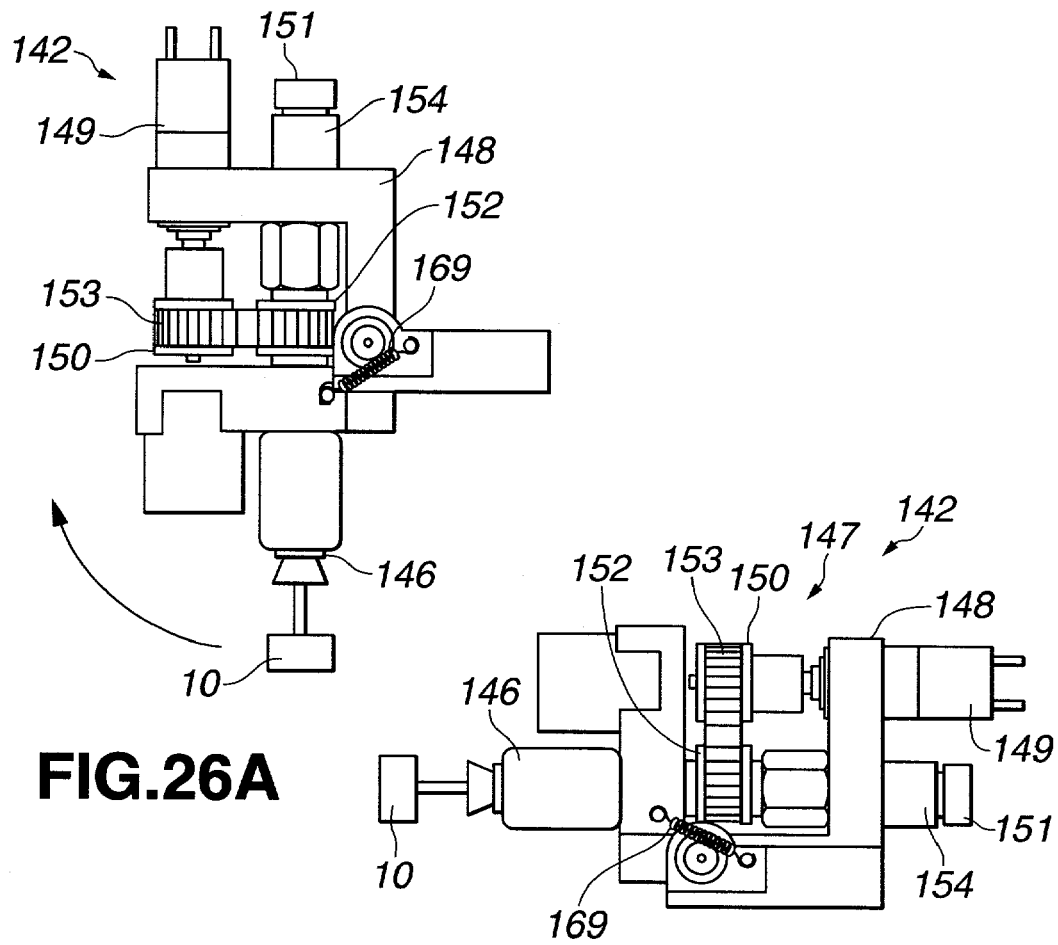
FIG.26A
FIG.26B

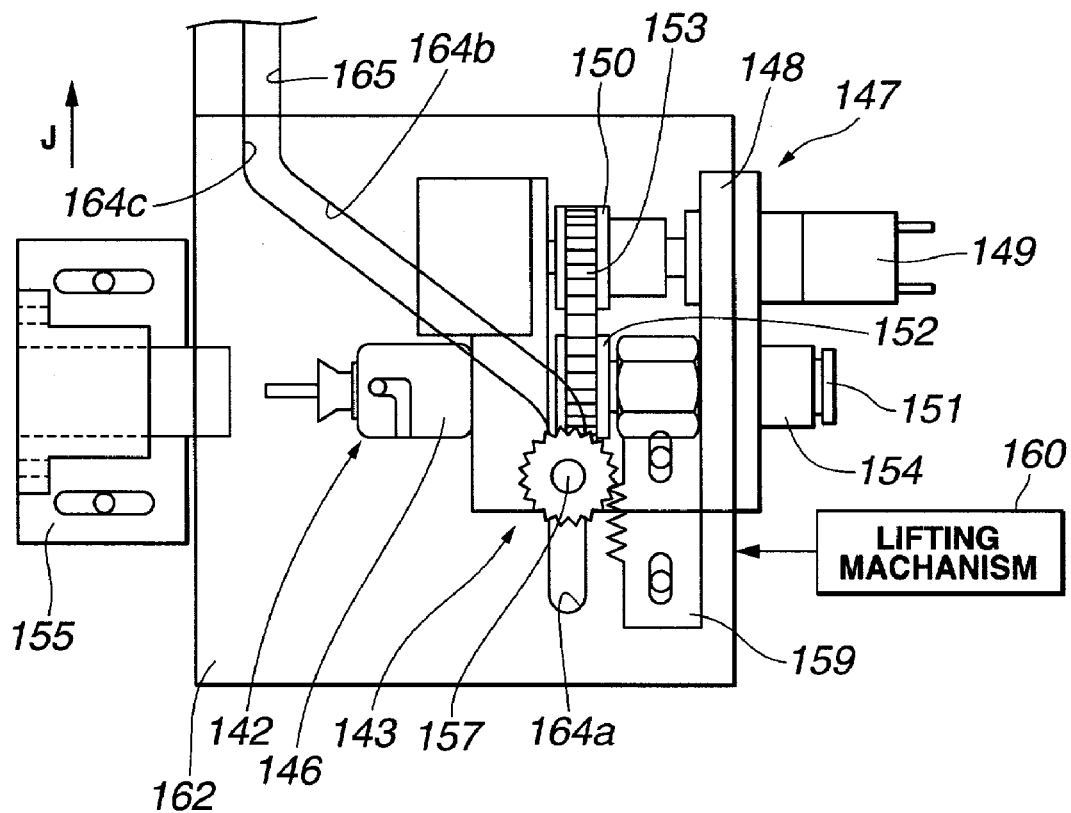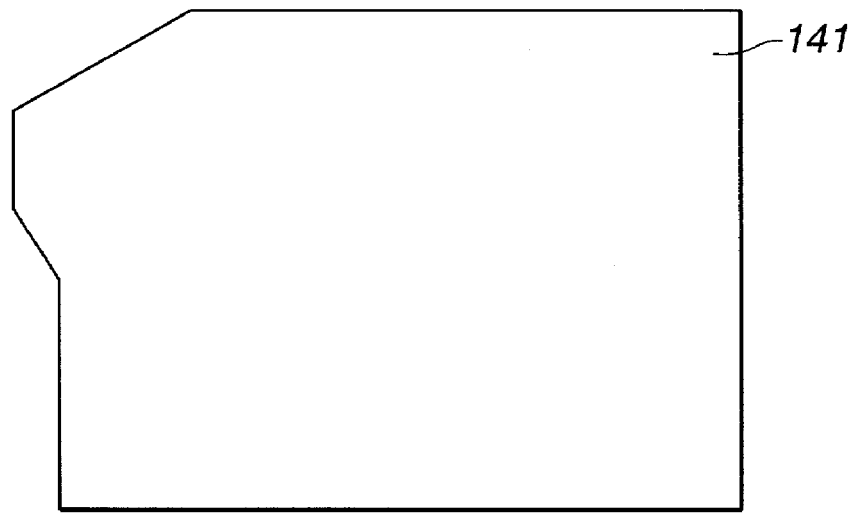
FIG.27

SYSTEM FOR MOUNTING ELECTRONIC DEVICE

TECHNICAL FIELD

The present invention generally relates to an electronics packaging system for packaging electronic parts on a printed wiring board.

BACKGROUND ART

Conventionally, cream solder is printed by a screen printing on the land of a printed wiring board on which electronic parts are to be mounted. As shown in FIG. 41, each of printers, generally indicated with a reference 300, used to print cream solder includes a transfer mechanism to bring a printed wiring board 301 while keeping it in horizontal position, a screen mechanism 303 provided opposite to the printed wiring board 301 being brought by the transfer mechanism 302, and a squeegee mechanism 304 to squeeze the cream solder from the screen mechanism 303 to the printed wiring board 301. First, the printed wiring board 301 is brought with one side thereof being directed opposite to the screen mechanism 303. When the printed wiring board 301 is brought to a predetermined position, the screen mechanism 303 is placed close to the printed wiring board 301, then the squeegee mechanism 304 is moved in the direction of arrow X in FIG. 41 to squeeze the cream solder to the printed wiring board 301. Thus the cream solder is printed on the printed wiring board 301.

To print cream solder on the land on the other side of the printed wiring board 301, first the printed wiring board 301 is inverted for the other side thereof to be opposite to the screen mechanism 303. Next, the printer 300 used to print cream solder on the one side of the printed wiring board 301 is used to print cream solder on the land on the other side of the printed wiring board 301 in a similar manner. However, in case the printer 300 once used to print cream solder on the one side of the printed wiring board is used again to print cream solder on the land of the printed wiring board, the screen mechanism 303 is replaced with a screen mechanism 303 having formed thereon a pattern prepared for the other side of the printed wiring board 301 to print cream solder, by screen printing, to the land on the other side of the board 301.

To print cream solder to either side of the printed wiring board 301 as in the above, a printer 300 has to be used for each side of the printed wiring board 301 in one pass, so that the electronics packaging system can hardly be designed more compact. Also, since cream solder has to be printed on each side of the printed wiring board 301 in one pass, the electronics packaging system can hardly package electronic parts with a further improved efficiency.

An electronics packaging system generally indicated with a reference 400 in FIG. 42 is used to mount electronic parts on a printed wiring board 401 having cream solder printed thereon as in the above. As shown in FIG. 42, the packaging system 400 includes a printer 402 to print cream solder on the land of a printed wiring board 401 by the screen printing, a placing unit 404 to place an electronic part 403 on the printed wiring board 401 having cream solder printed on the land thereof, and a reflow unit 405 to heat the printed wiring board 401 having the electronic part 403 placed thereon to melt the solder and thus solder the electronic part 403. In the packaging system 400 for the electronic parts 403, the printed wiring boards 401 are brought one after another while being held horizontally or laid on the transfer mechanism. The printed wiring board 401 is brought through the printer 402, placing unit 404 and reflow unit 405 located in the upper portion of FIG. 42 and has the electronic parts 403 placed on the first side thereof, and then inverted. Then, the printed wiring board 401 is brought through other printer 402, placing unit 404 and reflow unit 405 located in the middle portion of FIG. 42 and thus has electronic parts 403 mounted on the second side thereof.

As in the above, the electronics packaging system 400 needs the printer 402, placing unit 404 and reflow unit 405 to mount electronic parts 403 on the first side of the printed wiring board 401, and also the other printer 402, placing unit 404 and reflow unit 405 to mount electronic parts 403 on the second side of the printed wiring board 401. Further, the electronics packaging system 400 needs an inversion mechanism to invert the printed wiring board 401 having the electronic parts 403 soldered to the first side thereof. Thus, the electronics packaging system 400 can hardly be designed more compact and package the electronic parts 403 with a higher efficiency.

Next, the electronic parts placed on the printed wiring board are soldered by a solder reflow unit. The solder reflow unit used to solder the electronic parts includes a transfer mechanism to bring a printed wiring board while keeping it in horizontal position, a reflow furnace to heat the printed wiring board and melt the cream solder printed on the land of the printed wiring board, and a heating mechanism to heat the inside of the reflow furnace. The heating mechanism is disposed to face each main side of a printed wiring board brought held in horizontal position in order to heat the printed wiring board from above and below.

The printed wiring board first has electronic parts placed on one side thereof, and then brought into the reflow unit. The printed wiring board is heated in the reflow furnace of the reflow unit. The cream solder on the land is melted and then cooled, and thus the electronic parts are soldered. The printed wiring board having the electronic parts soldered to the one side thereof is inverted and has cream solder printed on the other side thereof, and then electronic parts are placed on the land. The printed wiring board is brought again into the reflow unit. The printed wiring board is heated in the reflow furnace of the reflow unit. The cream solder printed on the land on the other side is melted and cooled, an thus the electronic parts are soldered.

As in the above, to solder electronic parts to either side of a printed wiring board, soldering has to be done twice in the reflow unit. Thus, the soldering process can hardly be shortened further. Also, to solder electronic parts to either side of a printed wiring board, a reflow unit has to be provided for each side of the printed wiring board. Thus, the electronics packaging system can hardly be designed more compact.

In the conventional electronics packaging system, electronic parts are placed on a printed wiring board having been brought in horizontal position, namely, in laid position. More specifically, to mount electronic parts to either side of a printed wiring board, they are first placed on one side of the printed wiring board, then the printed wiring board is inverted, and electronic parts are placed on the other side of the printed wiring board.

As in the above, the process of mounting electronic parts can hardly be shortened further. Also, a placing unit has to be provided for either side of a printed wiring board. Thus, the electronics packaging system can hardly be designed more compact.

DISCLOSURE OF THE INVENTION

Accordingly, the present invention has a primary object to overcome the above-mentioned drawbacks of the prior art by providing an improved and novel electronics packaging system.

The present invention has another object to provide a printer in which a printed wiring board on which electronic parts are to be mounted is brought while being held in generally upright position to make it possible to print solder to the land on either side of the printed wiring board at a the same time, and which thus enables a more compact design of the electronics packaging system and higher speed of cream solder printing.

The present invention has a still another object to provide a novel electronics packaging system in which a printed wiring board on which electronic parts are to be mounted is brought while being held in a generally upright position to make it possible to print solder to the land on either side of the printed wiring board at a the same time, and place and solder the electronic parts on the lands, and which thus enables a more compact design of the electronics packaging system and improved efficiency of electronics packaging.

The present invention has a yet another object to provide a reflow unit in which a printed wiring board on which electronic parts are to be mounted is brought while being held in a generally upright position to solder the electronic parts to either side of the printed wiring board at a the same time, and which thus enables a more compact design of the electronics packaging system and higher speed of soldering.

The present invention has a yet still another object to provide an electronic part placing unit in which a printed wiring board on which electronic parts are to be mounted is brought while being held in a generally upright position to place electronic parts on either side of the printed wiring board at a the same time, and which thus enables a more compact design of the electronics packaging system and higher speed of electronic part placing.

The above objects can be attained by providing an electronics packaging system including:

a printer to print solder to either land of a printed wiring board;

a placing unit to place electronic parts on the lands of the printed wiring board, having the solder printed thereon by the printer; and a reflow unit to heat the printed wiring board on which the electronic parts have been placed by the placing unit and solder the electronic parts to the printed wiring board.

The printed wiring board is brought by a transfer mechanism, while being held in a generally upright position, through the printer, placing unit and reflow unit in this order. That is, the printer, placing unit and reflow unit are provided to face either side of the printed wiring board brought while being held in a generally upright position to print solder to either side of the printed wiring board at the same time, then place electronic parts on either side of the printed wiring board at the same time, and melt and cool the printed solder to solder the electronic parts placed on either side of the printed wiring board.

In the above electronics packaging system, the printer includes a detecting mechanism which detects the position of the land of a printed wiring board going to have solder printed on the land thereof by the printer. The detecting mechanism provides land-position data to the placing unit which will place electronic parts on the printed wiring board on the basis of the land-position data.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIG. 4A is a perspective view of the printed wiring board transfer mechanism included in the printer, and FIG. 4B is a side elevation of the transfer mechanism.

FIG. 5 is a perspective view of the carrying-arm moving mechanism.

FIG. 6 is a perspective view of the printed wiring board posture detector.

FIG. 7A is a perspective view of the printed wiring board inclination adjusting mechanism, and FIG. 7B is a side elevation of the adjusting mechanism.

FIG. 25 is a perspective view of the suction head.

FIGS. 26A and 26B are plan views of the part holding mechanism, showing the operations of the latter.

FIG. 27 is a plan view of the part holding mechanism in the second position.

BEST MODE FOR CARRYING OUT THE INVENTION

Figure 1:
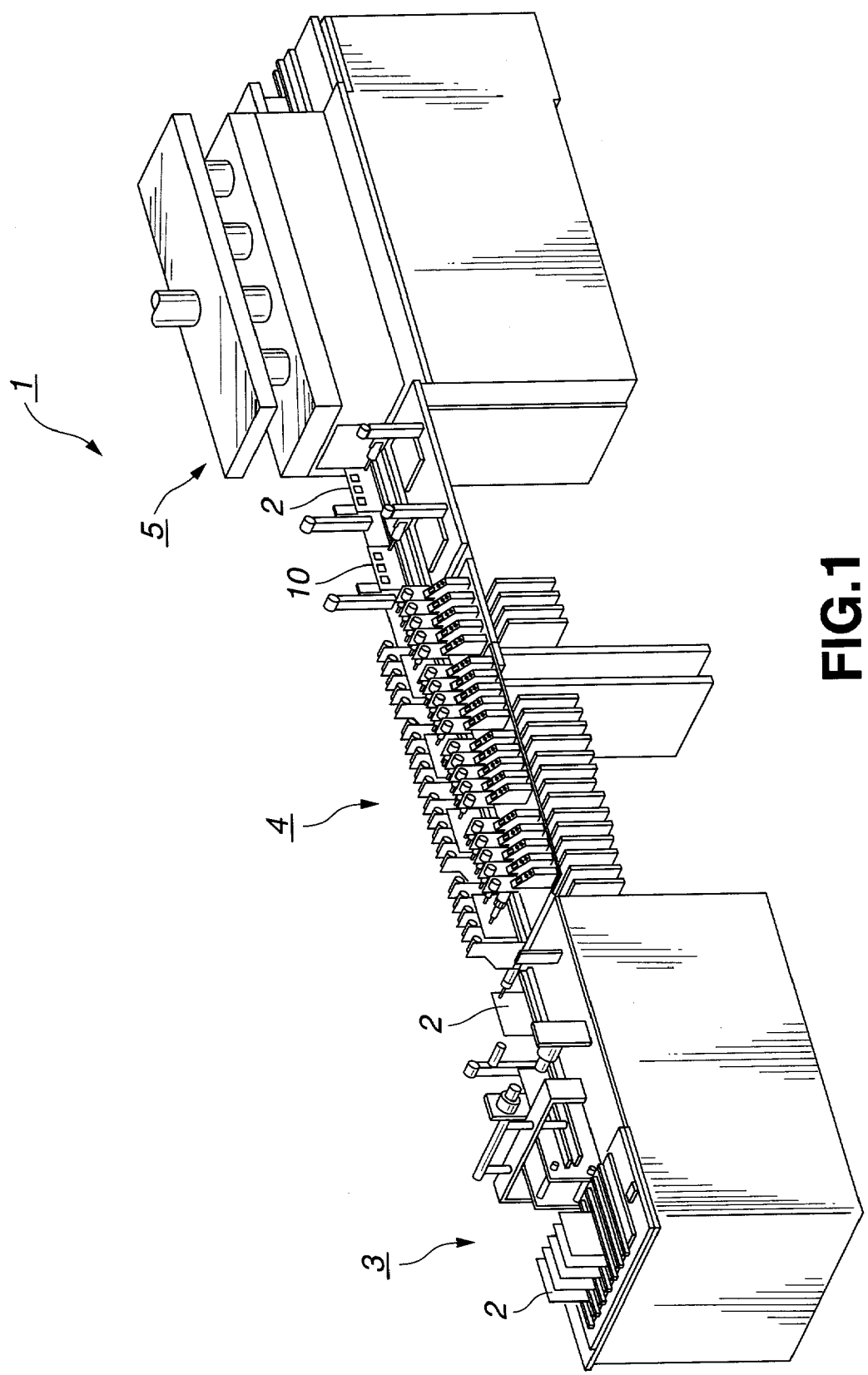
FIG. 1 is a perspective view of the electronics packaging system according to the present invention.

Referring now to FIG. 1, there is illustrated an electronics packaging system according to the present invention. The system is generally indicated with a reference 1.

As shown in FIG. 1, the electronics packaging system 1 includes a printer 3 which prints cream solder on the land of a printed wiring board 2, a placing unit 4 which place an electronic part 10 on the printed wiring board 2 having the cream solder printed thereon by the printer 3, and a reflow unit 5 which solders the electronic part 10 to the printed wiring board 2. In the electronics packaging system 1, the printed wiring board 2 is brought while being held in generally upright position. The printed wiring board 2 brought while being held in upright position has first cream solder printed on the land on either side thereof at the same time by the printer 3, next, electronic parts 10 placed on either side thereof at the same time by the placing unit 4, and then the electronic parts 10 soldered to either side thereof at the same time by the reflow unit 5.

In the above electronics packaging system 1, the printed wiring board 2 held in upright position is brought through the printer 3, placing unit 4 and reflow unit 5 in this order, whereby it can have the cream solder printed on either side thereof at the same time, electronic parts 10 placed on either side at the same time, and the electronic parts 10 soldered to either side at the same time. As having previously been described, the conventional electronics packaging system needs a printer, placing unit if and reflow unit provided for each side of a printed wiring board. In the electronics packaging system 1 according to the present invention, however, either side of a printed wiring board can be processed at the same time by one printer, one placing unit and one reflow unit. Namely, the electronics packaging system 1 according to the present invention can be constructed from a half of the numbers of the system units.

Thus, the entire system 1 can be designed more compact and electronic parts can be mounted on a printed wiring board in a reduced time. Also, since the printed wiring board 2 is brought while being held in upright position through the process from cream solder printing to soldering of electronic parts 10, the printed wiring board 2 can be prevented from being warped as in the conventional system in which a printed wiring board is brought while being laid or held in horizontal position.

The printer 3, placing unit 4 and reflow unit 5 included in the electronics packaging system 1 for the electronic parts 10 will further be described below with reference to the accompanying drawings.

Figure 2:
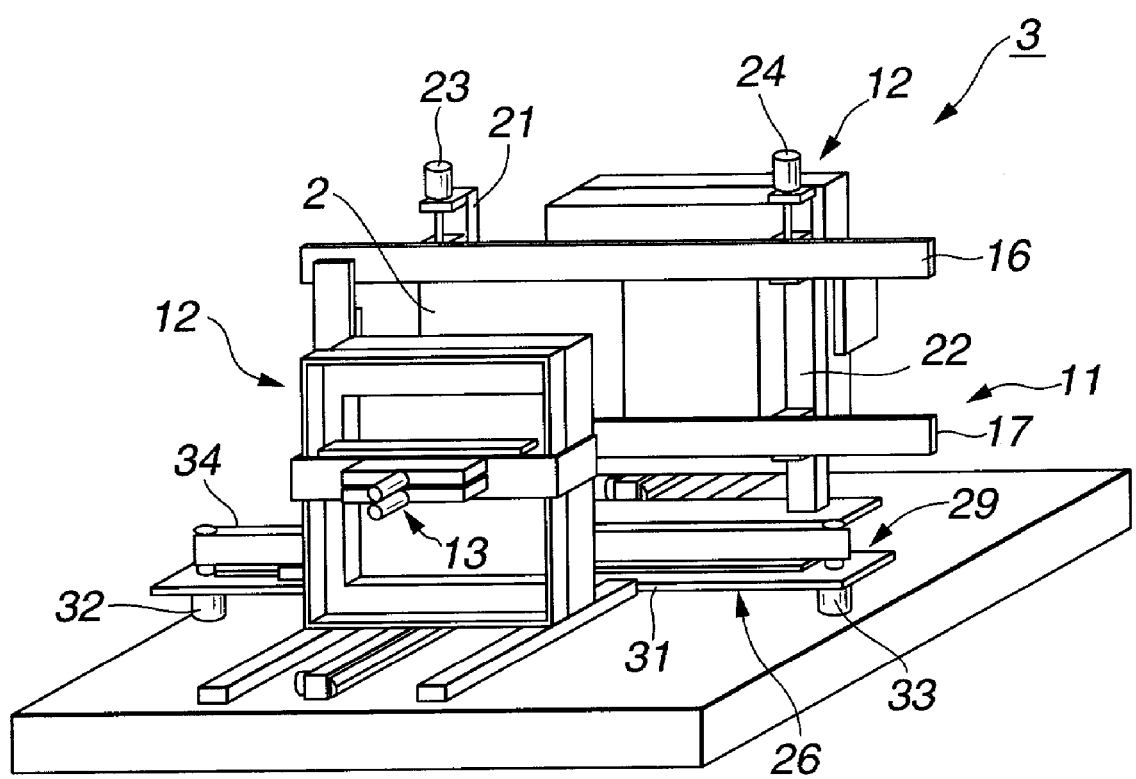
FIG. 2 is a perspective view of the printer included in the electronics packaging system according to the present invention.
Figure 3:
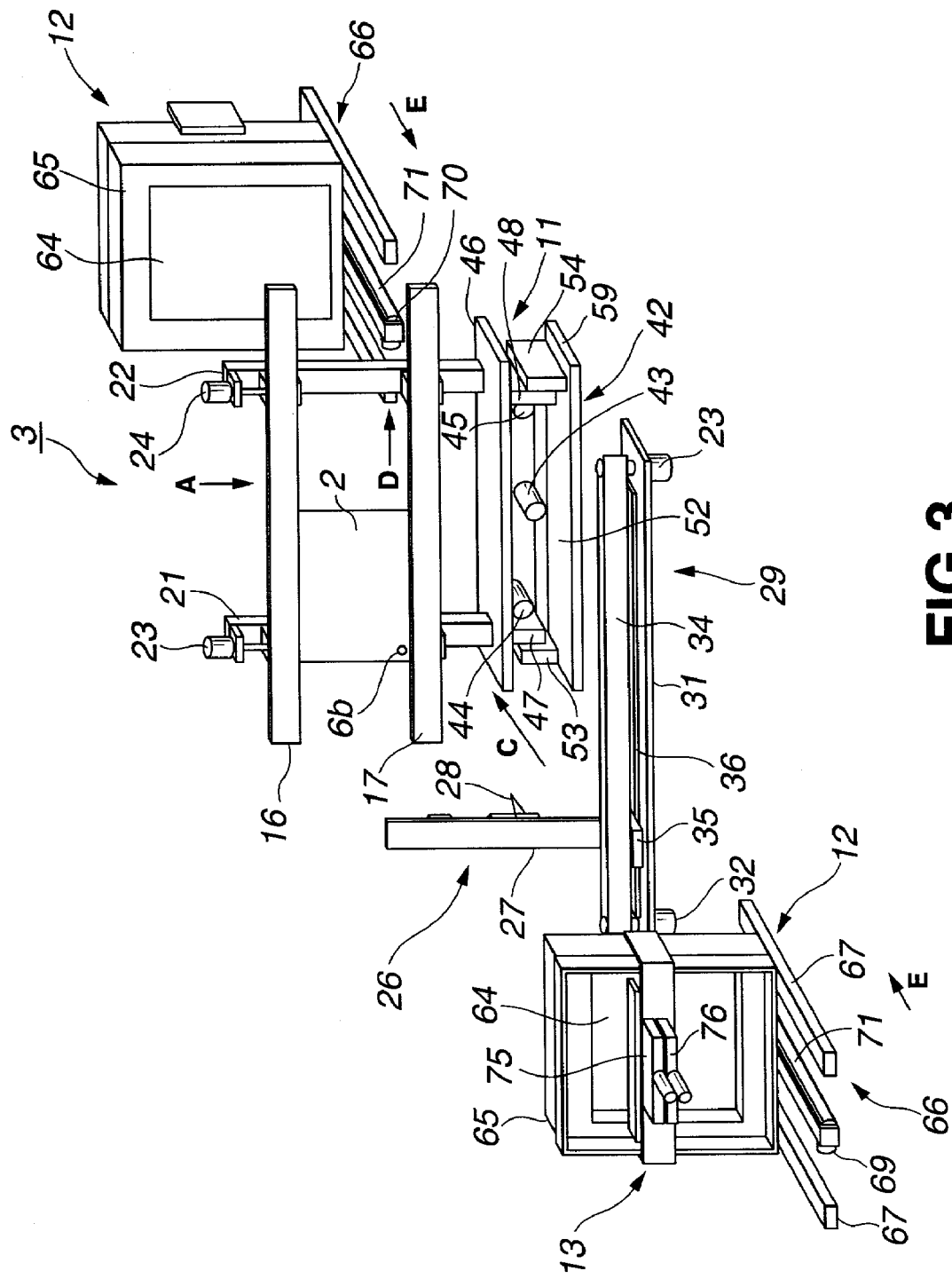
FIG. 3 is an exploded perspective view of the printer in FIG. 2.

First the printer 3 to print cream solder to either land of a printed wiring board is a screen printer, and includes, as shown in FIGS. 2 and 3, a transfer mechanism 11 to bring a printed wiring board 2 while keeping it in a generally upright position, a screen mechanism 12 to print cream solder to either land of the printed wiring board 2 supported by the transfer mechanism 11, a squeegee mechanism 13 to squeeze cream solder supplied to the screen mechanism 12 to the printed wiring board 2, and a drive mechanism 14 to slide the squeegee mechanism 13 towards the screen mechanism 12.

As shown in FIGS. 4A and 4B, the transfer mechanism 11 to bring the printed wiring board 2 includes a pair of guide rails 16 and 17 which engage and support opposite edges of the generally rectangular printed wiring board 2. As shown in FIG. 4B, each of the guide rails 16 and 17 in pair is formed from a base plate 18 nearly as thick as the printed wiring board 2 and holding plates 19 and 20 provided on lateral sides, respectively, of the base plate 18. Thus, each guide rail has a general shape of "C". The guide rail 17 catching and supporting the lower edge of the printed wiring board 2 works as a carrying rail for the printed wiring board 2, while the guide rail 16 catching and supporting the upper edge of the printed wiring board 2 works to force the printed wiring board 2 to the carrying guide rail 17.

The above guide rails 16 and 17 are installed to a pair of support members 21 and 22 perpendicular thereto as shown in FIG. 4A. The guide rail 16 is installed to the support members 21 and 22 movably in a direction parallel to the support members 21 and 22, that is, in the direction of arrow A and opposite direction in FIG. 4A. The guide rail 16 is connected to drive units 23 and 24 formed from a cylinder mechanism etc. And which move the guide rail 16 in the direction of arrow A and opposite direction in FIG. 4A. The drive units 23 and 24 are driven synchronously with each other to move the guide rail 16 along the support members 21 and 22 in the direction of arrow A in FIG. 4A when forcing the printed wiring board 2 to the carrying guide rail 17. For insertion and removal of the printed wiring board 2, the drive units 23 and 24 are moved along the support members 21 and 22 in the direction opposite to the direction of arrow A in FIG. 4A.

As shown in FIG. 5, the transfer mechanism 11 further includes a carrying-arm moving mechanism 26 to move the printed wiring board 2 caught and supported between the guide rails 16 and 17. The carrying-arm moving mechanism 26 includes a carrying arm 27 to bring the printed wiring board 2, a carrying pin 28 provided on the carrying arm 27 and which is to be engaged in an engagement hole 6b formed in the printed wiring board 2, and a drive mechanism 29 to move the carrying arm 27 in the direction of arrow B and opposite direction in FIG. 5 in which the printed wiring board is to be brought. The driving mechanism 29 includes a guide member 31 to guide the movement of the carrying arm 27, drive motors 32 and 33, and an endless driving belt 34 extended between and on the drive motors 32 and 33. Note that the engagement hole 6b is formed in a lower corner, of the printed wiring board 2, which is downstream with respect to the conveying direction.

The carrying arm 27 is disposed generally perpendicular to the guide rails 16 and 17, and fixed at one end thereof to a base 35 which is engaged on a guide sill 36 provided on the guide member 31. The carrying pin 28 provided on the carrying arm 27 is projected to the printed wiring board 2. The carrying pin 28 can be moved by a cylinder mechanism 37 in a direction in which it is engaged into or removed from the engagement hole 6b in the printed wiring board 2, namely, in the direction of arrow C and opposite direction in FIG. 5. The carrying pin 28 is moved in the direction of arrow C in FIG. 5 and engaged into the engagement hole 6b only when the printed wiring board 2 is brought.

Further, the carrying arm 27 is fixed to the driving belt 34. Therefore, when the drive motors 32 and 33 are in operation, the driving belt 34 runs to move the carrying arm 27 along the guide member 31 in the direction of arrow D and opposite direction in FIG. 5.

As shown in FIG. 6, the carrying arm 27 has provided thereon a detecting mechanism 38 to detect the posture of the printed wiring board 2 being carried. The detecting mechanism 38 includes a camera 39 having an imaging element such as CCD (charge-coupled device) element to detect a position detection mark 7 provided on the upper lateral edge of the printed wiring board 2, and a similar camera 40 to detect a position detection mark 8 provided in the lower lateral edge of the printed wiring board 2, namely, diagonally with respect to the position detection mark 7. Each of the position detection marks 7 and 8 includes two large-diameter marks and two small-diameter marks disposed in line as will seen from FIG. 6.

The camera 39 picks the position detection mark 7 when the printed wiring board 2 is supported between the guide rails 16 and 17. Next, when the printed wiring board 2 is brought in the direction of arrow D in FIG. 6, the camera 40 will pick up the position detection mark 8. Image data thus captured by the cameras 39 and 40 are supplied to a controller 15 which will detect, based on the image data, the inclination of the printed wiring board 2 supported between the guide rails 16 and 17.

Note that the controller 15 generates, based on the image data supplied from the cameras 39 and 40, land-position data for use to correct the inclination of the printed wiring board 2, and controls, based on the land-position data, first to third motors 43 to 45 included in an adjusting mechanism 42 which will further be described below. Also note that the land-position data indicates the land position involving an inclination of the printed wiring board 2 carried by transfer mechanisms 121a to 121d.

As shown in FIG. 7A, the transfer mechanism 11 includes the above-mentioned adjusting mechanism 42 to adjust the posture, that is, inclination, of the printed wiring board 2 being carried. The adjusting mechanism 42 includes the first motor 43 to adjust the position in the carrying direction of the printed wiring board 2 supported between the guide rails 16 and 17, namely, in the direction of arrow X in FIG. 7A, second motor 44 to adjust the height of the printed wiring board 2 on the side of the support member 21, namely, the height in the direction of arrow Y in FIG. 7A, and the third motor 45 to adjust the height of the printed wiring board 2 on the side of the support member 22, namely, the height in the direction of arrow Y in FIG. 7A.

As shown in FIG. 7A, the above support members 21 and 22 are fixed to a base plate 46 provided in parallel to the guide rails 16 and 17. The base plate 46 has adjusting members 47 and 48 provided on the side thereof opposite to the side where the support members 21 and 22 are provided. The adjusting members 47 and 48 are provided to adjust the height of the support members 21 and 22. Each of the adjusting members 47 and 48 has a rack 49 to adjust the height of the printed wiring board 2. The rack 49 extends in the direction of arrow Y in FIG. 7A.

The base plate 46 to which the above support members 21 and 22 are fixed is fixed to the adjusting block 51. The adjusting block 51 consists of a flat plate 52 parallel to the carrying direction of the printed wiring board 2, and vertical plates 53 and 54 fixed to opposite ends of the flat plate 52. Thus the adjusting block 51 has a general shape of "C". The flat plate 52 has formed thereon a rack 55 to move the adjusting block 51 in the direction of arrow X in FIG. 7A. A gear 56 fixed to the drive shaft of the first motor 43 fixed to a stationary member is in mesh with the rack 55. The flat plate 52 has guide members 57 and 58 provided on the other side thereof. The guide members 57 and 58 are engaged on a rail 60 provided on a base 59 and extending in the direction of arrow X in FIG. 7A. When the first motor 43 runs, the adjusting block 51 is moved along the rail 60 in the direction of arrow X in FIG. 7A.

As shown in FIG. 7B, each of the vertical plates 53 and 54 has fixed thereon a rail 61 which guides the base plate 46 moving in the direction of arrow Y in FIG. 7A. The rails 61 have engaged thereon the adjusting members 47 and 48, respectively, fixed to the base plate 46. Each of the adjusting members 47 and 48 has provided thereon the above-mentioned rack 49 on which there is engaged a gear 62 fixed to the drive shaft of each of the second and third motors 44 and 45 installed to the stationary members. Thus, the adjusting block 51 is moved along the rails 61 in the direction of arrow Y in FIG. 7A when the second and third motors 44 and 45 run.

In the adjusting mechanism 42 constructed as in the above, the first to third motors 43, 44 and 45 are independently controlled by the controller 15. For example, when it is detected by the detecting mechanism 38 that the printed wiring board 2 supported between the guide rails 16 and 17 is inclined downward on the side of the support member 22, the controller 15 will drive the third motor 45 to raise the base plate 46 on the side of the support member 22. When cream solder is to be printed, if it is detected by the detecting mechanism 38 that the printed wiring board 2 is found moved excessively in the direction of arrow D in FIG. 7A, namely, in the carrying direction, the controller 15 will drive the first motor 43 to move the base plate 46 in the direction opposite to the direction of arrow D in FIG. 7A.

Figure 8:
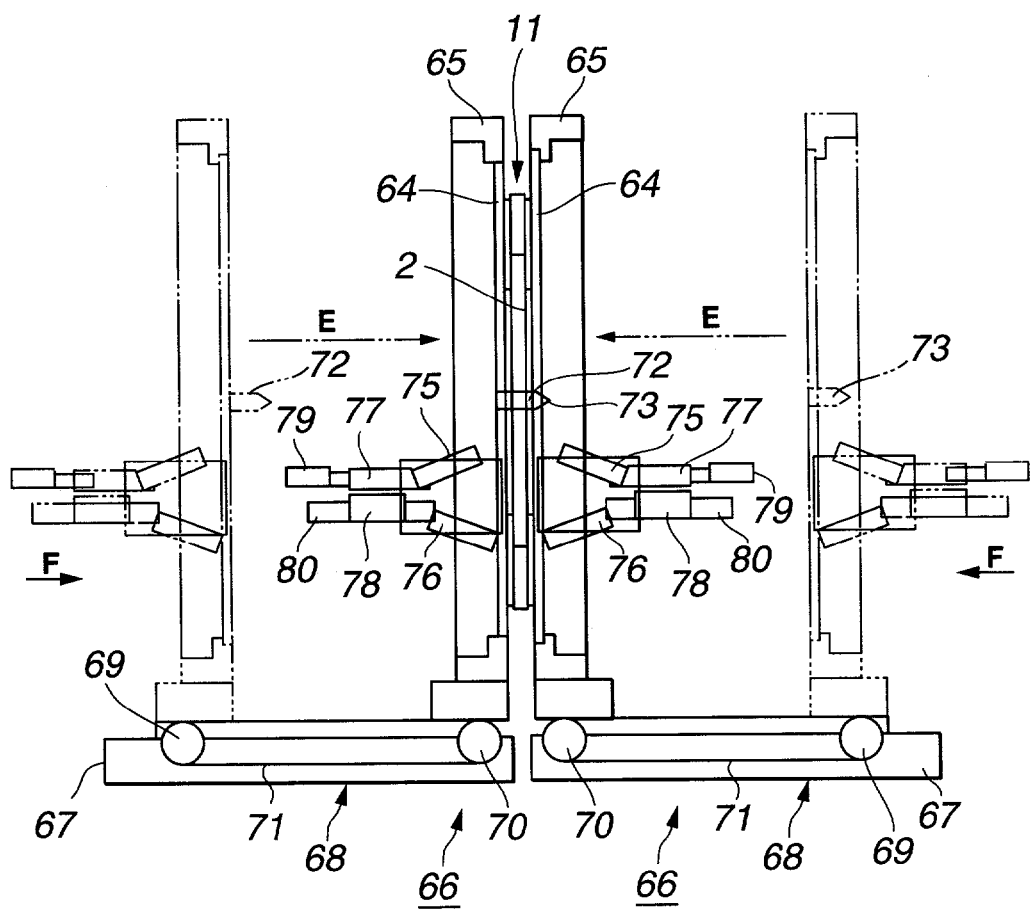
FIG. 8 is a side elevation of the screen mechanism and the squeegee mechanism provided in the screen mechanism.

As shown in FIG. 8, each of the screen mechanisms 12 to print cream solder to the land on either side of the printed wiring board 2 supported in the transfer mechanism 11 includes a screen 64 having formed thereon a pattern corresponding to the land of the printed wiring board 2 on which the cream solder is to be printed, and a screen frame 65 to which the screen 64 is tensely attached. The screen mechanism 12 is disposed for the screen 64 thereof to face each side of the printed wiring board 2 supported in the transfer mechanism 11. The screen 64 is for example a metal screen of about 170 to 200 μm in thickness.

The screen mechanism 12 disposed on either side of the printed wiring board 2 supported in the transfer mechanism 11 is moved towards the printed wiring board 2 only when cream solder is to be printed to the printed wiring board 2.

For carrying the printed wiring board 2, the screen mechanism 12 is moved away from the printed wiring board 2 supported in the transfer mechanism 11.

To move the screen mechanisms 12 in a direction towards or away from the printed wiring board 2 supported in the transfer mechanism 11, there are provided moving mechanisms 66 each including, as shown in FIG. 8, a guide member 67 and driving mechanism 68, provided to support the screen frames 65 and move the screen frame 65 towards and away from the printed wiring board 2 supported in the transfer mechanism 11 in the directions of arrow E and opposite direction in FIG. 8. Each of the driving mechanisms 68 includes a drive motor 69 and an endless driving belt 71 extended between and on the drive motor 69 and a drive motor 70. The screen frame 65 is fixed to the driving belt 71. When the drive motor 69 is put into operation, the driving belt 71 runs to move the screen frame 65 along the guide member 67 in the direction of the direction of arrow E and opposite direction in FIG. 8.

As shown in FIG. 8, one of the screen frames 12 has a positioning pin 72 provided thereon, while the other screen frame 12 has a positioning concavity 73 formed therein. When the screen frames 65 are moved close to each other, the positioning pin 72 is engaged into the positioning concavity 73 to position the screen frames 65.

To squeeze cream solder supplied to the screen mechanisms 12 to the printed wiring board 2, there are provided the squeegee mechanisms 13 each disposed on the side of the screen mechanism 12 opposite to the side thereof facing the printed wiring board 2 as shown in FIG. 8. Each of the squeegee mechanisms 13 includes a first squeegee 75 adapted to be moved downward from the upper portion of the screen mechanism 12 to squeeze cream solder to the printed wiring board 2, and a second squeegee 76 adapted to be moved upward from the lower portion of the screen mechanism 12 to squeeze cream solder to the printed wiring board 12, as will be seen from FIG. 8.

The squeegee mechanisms 13 will further be described below with reference to FIGS. 9 and 10. As shown, each of the squeegee mechanisms 13 includes the first and second squeegees 75 and 76 to squeeze cream solder supplied to the screen mechanism 12 to the printed wiring board 2, squeegee holders 77 and 78 to which the first and second squeegees 75 and 76 are fixed respectively, and cylinder mechanisms 79 and 80 to move the first and second squeegees 75 and 76 fixed to the squeegee holders 77 and 78, respectively, towards and away from the screen 64.

The first and second squeegees 75 and 76 are made of an elastic material such as polyurethane resin. Also, the first and second squeegees 75 and 76 are fixed to the squeegee holders 77 and 78, respectively, for an acute angle to be defined between the screen 64 and moving directions of the first and second squeegees 75 and 76. Thus, the first and second squeegees 75 and 76 can positively squeeze cream solder from the screen 64 to the printed wiring board 2.

Figure 9:
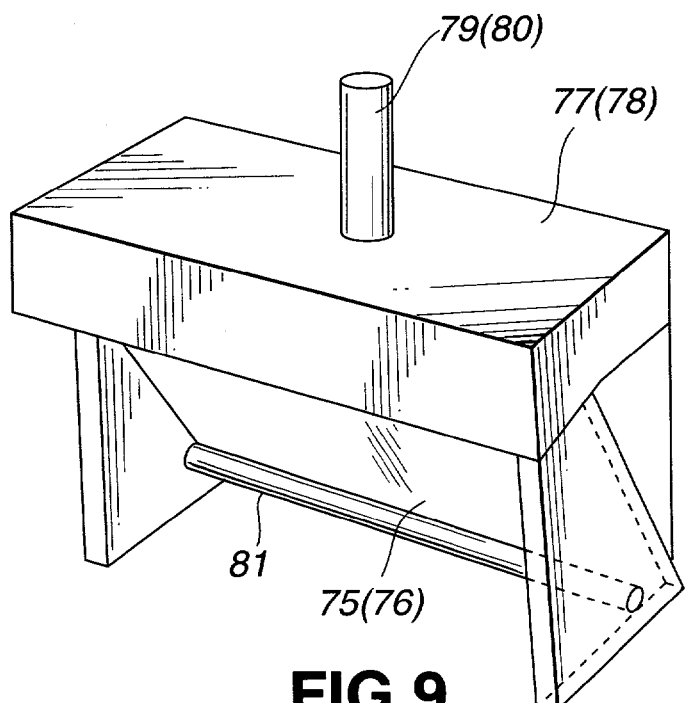
FIG. 9 is a perspective view of the squeegee mechanism.
Figure 10:
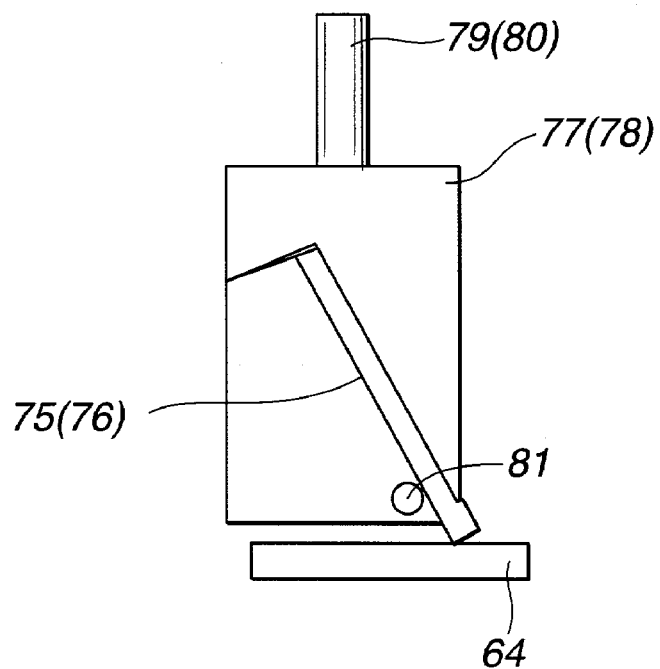
FIG. 10 is a side elevation of the squeegee mechanism in FIG. 9.

Further, as shown in FIG. 9, the squeegee holder 77 (78) has a rolling promoting arm 81 provided near the first (second) squeegee 75 (76) to roll a cream solder 9 when the latter is going to be squeezed from the screen 64 to a position near the screen 64, for example, to a position of 5 mm from the screen 64. Note that when this rolling promoting arm 81 is not provided, the cream solder 9 will gravitationally flow down but the rolling prompting arm 81 will assure that the cream solder 9 is rolled in the direction of arrow and positively forced out by the first (second) squeegee 75 (76) to the side of the screen 64 opposite to the squeegee 75 as shown in FIG. 11.

Figure 12:
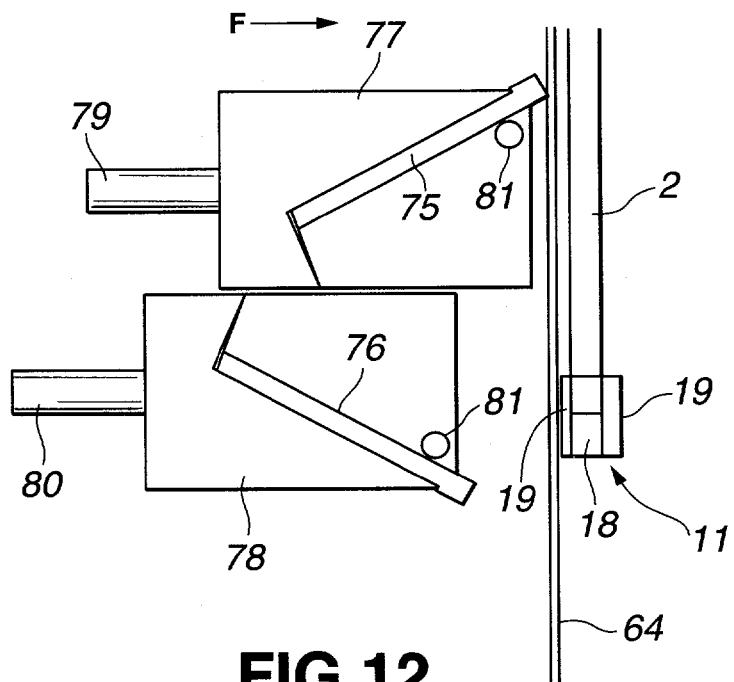
FIG. 12 is a side elevation of the squeegee mechanism, showing the operations of the squeegee mechanism.

The cylinder mechanism 79 is provided on the squeegee holder 77 to which the first squeegee 75 is fixed as in the above, while the cylinder mechanism 80 is provided on the squeegee holder 78 to which the second squeegee 76 is fixed. The cylinder mechanism 79 provides a driving mechanism as in the above. As shown in FIG. 12, for example, when the squeegee mechanism 13 is moved down from above in FIG. 12, the cylinder mechanism 79 is activated to move the first squeegee 75 in the direction of arrow F in FIG. 12 towards the screen 64 to a position where the squeegee 75 is ready for squeezing the cream solder. At this time, the cylinder mechanism 80 is not in action but has been moved in the direction opposite to the direction of arrow F in FIG. 12 to a position where it is separate from the screen 64. When the squeegee mechanism 13 is moved upward from below in FIG. 12, the cylinder mechanism 80 is activated to move the second squeegee 76 in the direction of arrow F in FIG. 12 to a position where it is ready to squeeze the cream solder. At this time, the cylinder mechanism 79 is not in action but has been moved in the direction opposite to the direction of arrow F in FIG. 12 to a position where it is separate from the screen 64. Namely, the printed wiring board 2 supported in the transfer mechanism 11 will not be inclined during printing of the cream solder since each side of the printed wiring board 2 can be pressed at predetermined positions thereon by the first squeegee 75 and second squeegee 76 of each screen mechanism 12.

Figure 11:
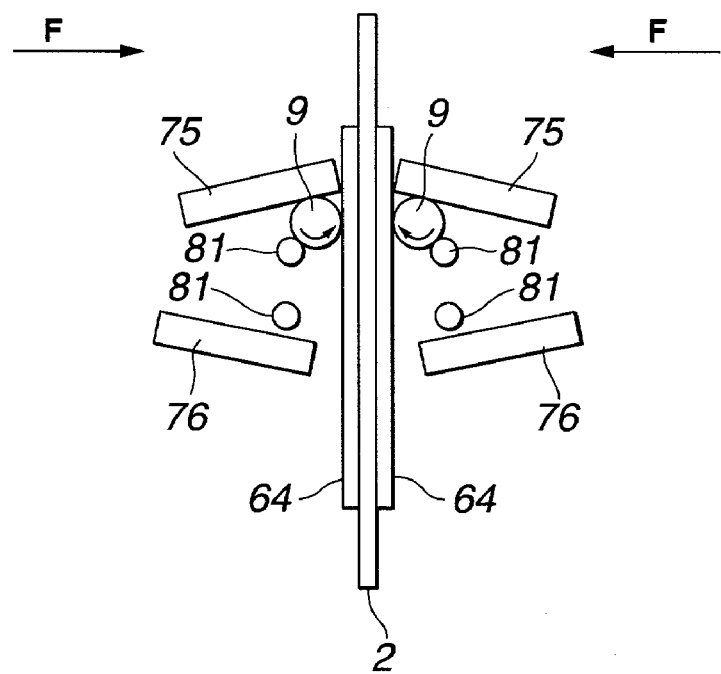
FIG. 11 is a side elevation of the rolling promoting arm provided on the squeegee holder, showing the relation between the arm and cream solder.
Figure 13A:
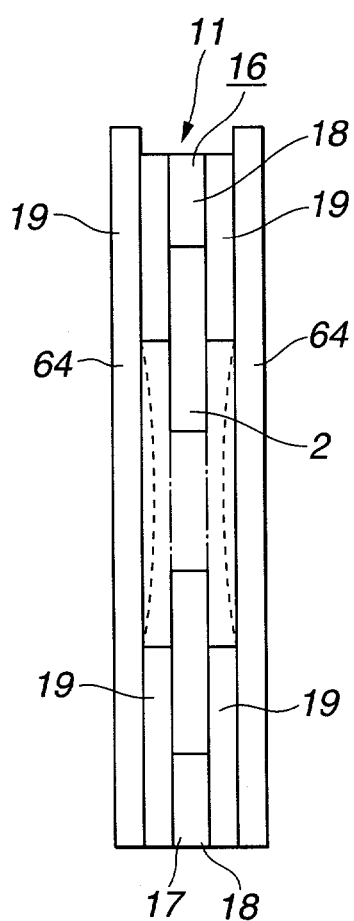
FIGS. 13A and 13B are side elevations of the screen and the holding plates included in the transfer mechanism, showing the relation between the deflection of the screen and the thickness of the holding plate.
Figure 13B:
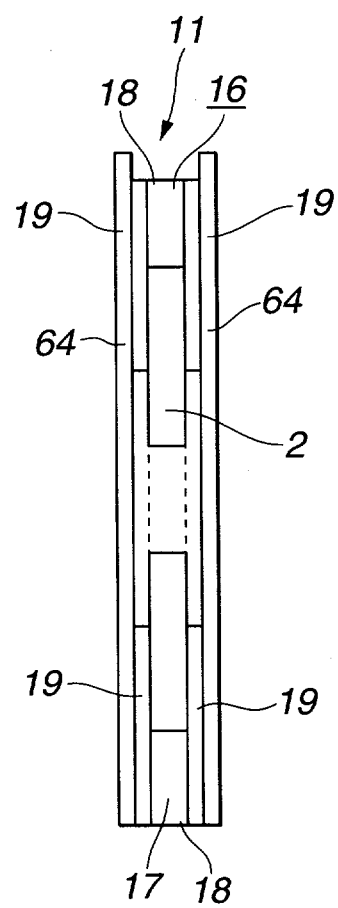

As shown in FIG. 13B, when the screens 64 have been moved in the directions of arrow E in FIG. 8, respectively, and the first squeegee 75 or second squeegee 76 has been moved in the direction of arrow F in FIG. 11 to squeeze the cream solder to the printed wiring boards 2, respectively, supported in the transfer mechanism 11, the screens 64 are deflected in the directions in which they are forced by the first squeegee 75 or second squeegee 76 and put into close contact with corresponding sides of the printed wiring board 2. At this time, if the holding plates 19 and 20 included in each of the guide rails 16 and 17 are too thick, the screens 64 will not be put in close contact with the printed wiring board 2 even when they are pressed by the first squeegee 75 or second squeegee 76, so that cream solder cannot be printed to a predetermined area on the printed wiring board 2. This is illustrated in FIG. 13A. For this reason, the holding plates 19 and 20 included in the transfer mechanism 11 may be designed to have a thickness of about 80 $\mu$m (conventionally, 170 to 200 $\mu$m) for positive close contact between the deflected screens 64 and printed wiring board 2 as shown in FIG. 13B.

Figure 14:
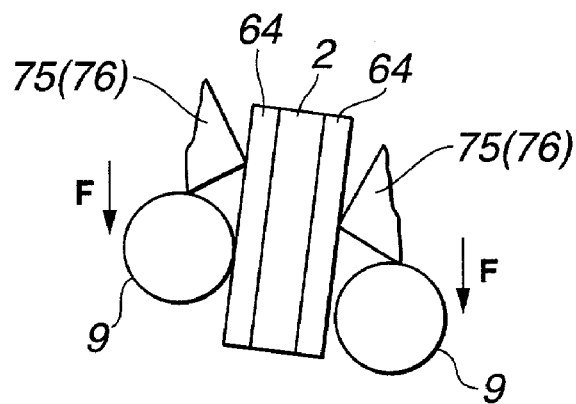
FIG. 14 is a side elevation of the printed wiring board, showing the states of the wiring board at different squeegee sliding speeds.

If the first squeegee 75 or second squeegee 76 included in the screen mechanism 12 is slid at different speeds towards the screen 64 when the squeegee mechanism 13 constructed as in the above, a pressure will be applied to different positions on each side of the printed wiring board 2 and thus the printed wiring board 2 supported in the transfer mechanism 11 will be inclined, as shown in FIG. 14, so that cream solder cannot positively be printed on the printed wiring board 2.

Figure 15:
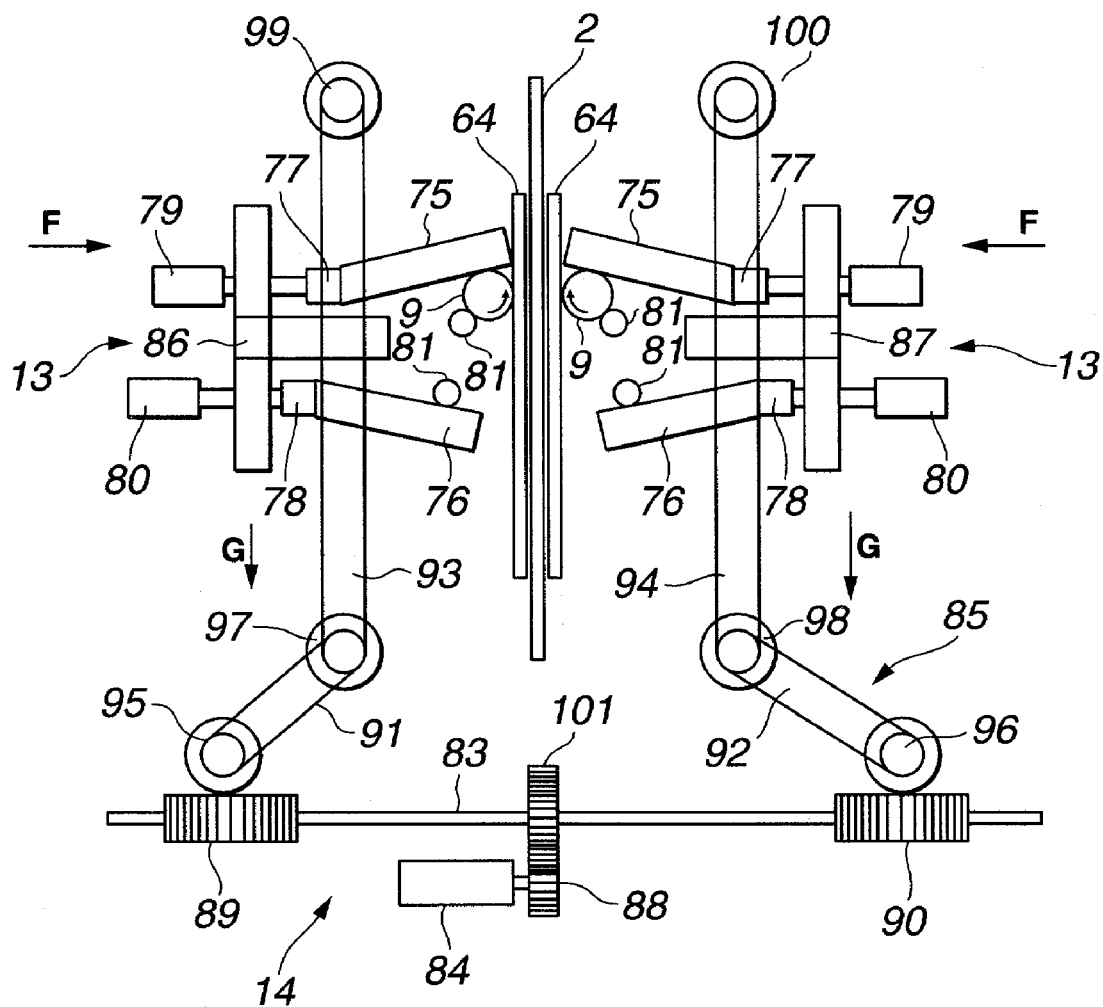
FIG. 15 is a plan view of the drive mechanism to move the squeegee mechanism.

There is provided a driving mechanism 14 to slide the squeegee mechanism 13 towards the screen 64, and it includes, as shown in FIG. 15, a drive motor 84, driving force transmission 85 to transmit a driving force from the drive motor 84, and moving members 86 and 87 to move the squeegee mechanism 13 by means of the driving force transmission 85. The drive motor 84 has fixed to the drive shaft thereof a pinion 88 coupled to the driving force transmission 85. The drive motor 84 thus slides the squeegee mechanism 13 disposed in the screen mechanism 12 in relation to the screen 64. The moving member 86 has fixed thereto the squeegee holder 77 included in one of the squeegee mechanisms 13, while the moving member 87 has fixed thereto the squeegee holder 78 included in the other squeegee mechanism 13.

The driving force transmission 85 having coupled thereto the pinion 88 fixed to the drive shaft of the drive motor 84 has a shaft 83 has fixed to the middle portion thereof an intermediate gear 101 engaged with the pinion 88 fixed to the drive shaft of the drive motor 84 and also fixed to the opposite ends thereof worms 89 and 90 of which one is provided to move one of the squeegee mechanism 13 and the other is to move the other squeegee mechanism 13.

The driving force transmission 85 includes driving force transmitting belts 91 and 92 and moving belts 93 and 94 to which the moving members 86 and 87 fixed to the squeegee mechanisms 13, respectively, are fixed respectively. The driving force transmitting belts 91 and 92 are an endless belt and extended between and on rollers 95 and 97, and 96 and 98, respectively. The rollers 95 and 96 are in mesh with the worms 89 and 90, respectively, while having the driving force transmitting belts 91 and 92 wound thereon, respectively. The moving belts 93 and 94 are also an endless belt and extended between and on the rollers 97 and 99, and 98 and 100, respectively. The roller 97 has the driving force transmitting belt 91 and moving belt 93 wound together thereon, while the roller 98 has the driving force transmitting belt 92 and moving belt 94 wound together thereon. These rollers 97 and 98 work as a driving force transmitting roller to transmit the driving force from the driving force transmitting belts 91 and 92 to the moving belts 93 and 94, respectively.

In the above driving mechanism 14, first, when the drive motor 84 is put into run, the shaft 83 is rotated by means of the pinion 88 and intermediate gear 101 and hence the worms 89 and 90 are rotated. Then, the rollers 95 and 96 in mesh with the worms 91 and 92, respectively, are rotated and the driving force transmitting belts 91 and 92 run in the same direction. When the rollers 97 and 98 on which the driving force transmitting belts 91 and 92 are wound respectively are rotated, the moving belts 93 and 94 wound on the rollers 97 and 98, respectively, run so that the moving members 86 and 87 fixed to the moving belts 93 and 94, respectively, are moved in the direction of arrow G and opposite direction in FIG. 15. Thus, the squeegee mechanisms 13 fixed to the moving members 86 and 87, respectively, are also moved in the direction of arrow G and opposite direction in FIG. 15, namely, up and down in FIG. 8. Since in the driving mechanism 14, a driving force can be transmitted from the drive motor 84 to the driving shaft 83 with the worms 89 and 90 provided at the opposite ends thereof to allow, by means of the driving force transmitting belts 91 and 92, the moving belts 93 and 94 to run in the same direction at the same speed, so the squeegee mechanisms 13 disposed in the screen mechanisms 12 respectively can be moved in the same direction at the same speed. Also, since the printed wiring board 2 supported in the transfer mechanism 11 will be applied always at the same position on either side thereof with a pressure by the first squeegees 75 or second squeegees 76 in the squeegee mechanisms 13, so the driving mechanism 14 permits to prevent the printed wiring board 2 from being inclined as shown in FIG. 14.

Figure 16:
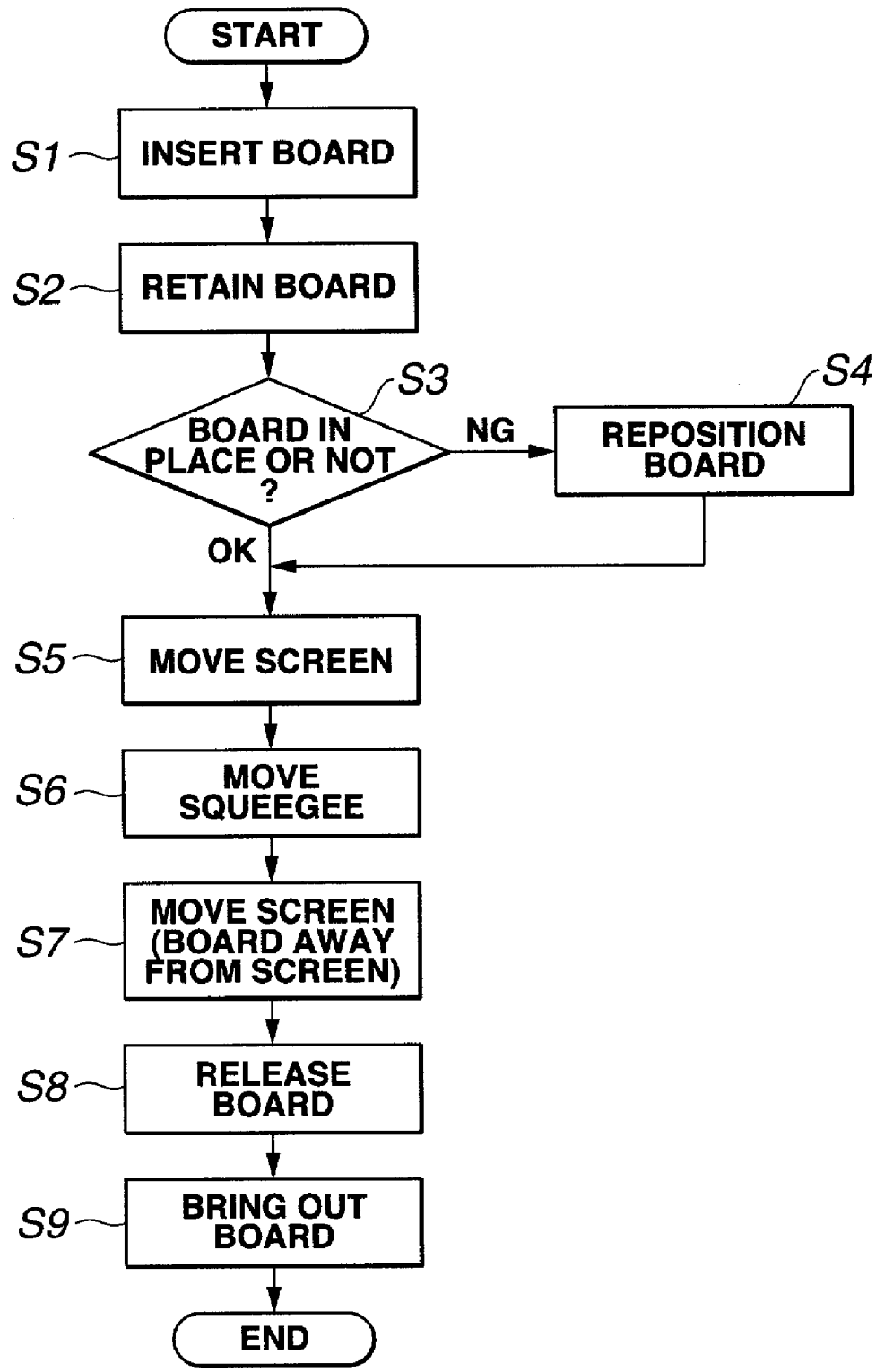
FIG. 16 shows a flow of operations of the printer.

Next, the printer 3 constructed as in the above functions as will be described below with reference to FIG. 16. Before the printed wiring board 2 is put into the transfer mechanism 11, the guide rail 16 is moved in the direction of arrow A in FIG. 4A such that the printed wiring board 2 can be set between the guide rails 16 and 17 as shown in FIG. 4. Then in step S1, the printed wiring board 2 is set in the transfer mechanism 11. In step S2, the drive units 23 and 24 are put into operation to move the guide rail 16 along the support members 21 and 22 in the direction of arrow A in FIG. 4A, whereby the printed wiring board 2 will be forced to the carrying guide rail 17 and supported between the guide rails 16 and 17.

The camera 39 will pick up the position detection mark 7 on the printed wiring board 2 as shown in FIG. 6. The image data thus acquired is supplied to the controller 15. Next, the carrying pin 28 provided on the carrying arm 27 is moved in the direction of arrow C in FIG. 5 and engaged in the engagement hole 6b. Then when the drive motors 32 and 33 are put into operation, the driving belt 34 will run and thus the carrying arm 27 is moved along the guide member 31 in the direction of arrow D in FIG. 5 to bring the printed wiring board 2 to the printing position.

In step S3, the camera 40 picks up the position detection mark 8 on the printed wiring board 2 as shown in FIG. 6. The image data thus acquired is supplied to the controller 15. Based on the image data on the position detection mark 7 image by the camera 39, and image data on the position detection mark 8 imaged by the camera 40, the controller 15 will detect the posture of the printed wiring board 2 and generate land-position data indicative of the position of a land to which cream solder is to be printed. When it is judged in step S3 that the printed wiring board 2 is not out of place, the procedure goes to a next step. If the printed wiring board 2 is found out of place, the printed wiring board 2 is repositioned, in step S4, based on the land-position data. For this repositioning, the carrying pin 28 provided on the carrying arm 27 is moved in the direction opposite to the direction of arrow C in FIG. 5 for disengagement from the engagement hole 6b so that the printed wiring board 2 can be repositioned. Thereafter, if it is detected by the detecting mechanism 38 that the printed wiring board 2 supported between the guide rails 16 and 17 is inclined downward on the side of the support member 22 in FIG. 7A, the third motor 45 is put into operation to move the base plate 46 upward on the side of the support member 22. If the printed wiring board 2 is found excessively moved in the direction of arrow D in FIG. 7A in which the printed wiring board 2 is to be brought for printing cream solder, the first motor 43 is put into operation to move the base plate 46 in the direction opposite to the direction of arrow D.

In step S5, the screen mechanisms 12 are moved towards the printed wiring board 2 in order to print cream solder to the land on either side of the printed wiring board 2. More specifically, when the drive motors 69 and 70 are put into action, the driving belt 71 runs, whereby the screen frames 65 are moved along the guide members 67 in the direction of arrow E in FIG. 8. At this time, when the screen frames 65 are moved close to each other, the positioning pin 72 and positioning concavity 73 provided on the screen frame 65 are engaged with each other to position the screen frames 65.

Next in step S6, the squeegee mechanisms 13 are moved while being in contact with the screens 64, respectively, in order to print cream solder to the corresponding lands of the printed wiring board 2. That is, when the drive motor 84 is put into action, the shaft 83 is rotated by means of the pinion 88 and intermediate gear 101 and also the worms 89 and 90 are rotated, as shown in FIG. 15. Then, the rollers 95 and 96 in mesh with the worms 89 and 90, respectively, are rotated while the driving force transmitting belts 91 and 92 are made to run in the same direction. As the rollers 97 and 98 on which the driving force transmitting belts 91 and 92 are wound, respectively, are rotated, the moving belts 93 and 94 wound on the rollers 97 and 98 are also made to run. Thus, the moving members 86 and 87 fixed to the moving belts 93 and 94, respectively, are moved in the direction of arrow G and opposite direction in FIG. 15. Thereby, the squeegee mechanisms 13 fixed to the moving members 86 and 87, respectively, are moved in the direction of arrow G and opposite direction in FIG. 15, that is, up and down in FIG. 8. At this time, the screens 64 are deflected in the directions in which they are forced by the first squeegee 75 or second squeegee 76, and put into close contact with the corresponding sides of the printed wiring board 2. Thus the cream solder is printed on the lands of the printed wiring board 2. At this time, since the holding plates 19 and 20 included in the transfer mechanism 11 are formed thinner than ever, so the deflected screens 64 will be positively put into close contact with the printed wiring board 2 as shown in FIG. 13A.

Since the driving mechanism 14 transmits the driving force from the drive motor 84 to the shaft 83 having the worms 89 and 90 provided at the opposite ends thereof and thus to the driving force transmitting belts 91 and 92 wound on the worms 89 and 90 to rotate the moving belts 93 and 94 in the same direction at the same speed, so the squeegee mechanisms 13 included in the screen mechanisms 12, respectively, can be moved in the same direction at the same speed. Therefore, since the printed wiring board 2 supported in the transfer mechanism 11 is applied always at the same position thereof with the same pressure by the first squeegee 75 or second squeegee 76 included in the squeegee mechanism 13, so the driving mechanism 14 permits to positively print cream solder to the lands of the printed wiring board 2 while preventing the printed wiring board 2 from being inclined as shown in FIG. 14.

When the cream solder printing is complete, the screen mechanisms 12 are moved away from the printed wiring board 2 in step S7. More specifically, when the drive motors 69 and 70 are put into action, the driving belt 71 runs as shown in FIG. 8, whereby the screen frames 65 are moved along the guide members 67, respectively, in the direction opposite to the direction of arrow E in FIG. 3. Thus, the printed wiring board 2 can be carried by the transfer mechanism 11 in the direction of arrow D in FIG. 3.

In step S8, the drive units 23 and 24 are put into action to move the guide rail 16 along the support members 21 and 22 in the direction opposite to the direction of arrow A in FIG. 4A. Thereby, the transfer mechanism 11 is ready to carry the printed wiring board 2. In step S9, the printed wiring board 2 having the cream solder printed on the lands thereof is brought out.

In the printer 3 constructed as in the above, since the printed wiring board 2 is supported in upright position in the transfer mechanism 11, so cream solder can be printed on the lands on both sides of the printed wiring board 2 at the same time, which leads to a shorter time for solder printing and more compact design of the electronics packaging system than in the conventional system in which cream solder is printed on each side of the printed wiring board. Also in the printer 3, since the holding plates 19 and 20 included in the transfer mechanism 11 are designed to have a thickness of about 80 μm (conventionally, 170 to 200 μm) for positive close contact of the deflected screens 64 with the lands of the printed wiring board 2, so cream solder can positively be printed on the lands of the printed wiring board 2. Further, since in the driving mechanism 14, a driving force can be transmitted from the drive motor 84 to the driving shaft 83 with the worms 89 and 90 provided at the opposite ends thereof to allow, by means of the driving force transmitting belts 91 and 92, the moving belts 93 and 94 to run in the same direction at the same speed, so the squeegee mechanisms 13 disposed in the screen mechanisms 12 respectively can be moved in the same direction at the same speed. Also, since the printed wiring board 2 supported in the transfer mechanism 11 will be applied always at the same position on either side thereof with a pressure by the first squeegees 75 or second squeegees 76 in the squeegee mechanisms 13, so the driving mechanism 14 permits to prevent the printed wiring board 2 from being inclined as shown in FIG. 14 and cream solder can positively be printed on the lands of the printed wiring board 2.

Note that besides the printing of cream solder, the printer 3 may be used to print solder resist in a predetermined pattern on the surface of a printed wiring board having a wiring pattern formed thereon.

Figure 17:
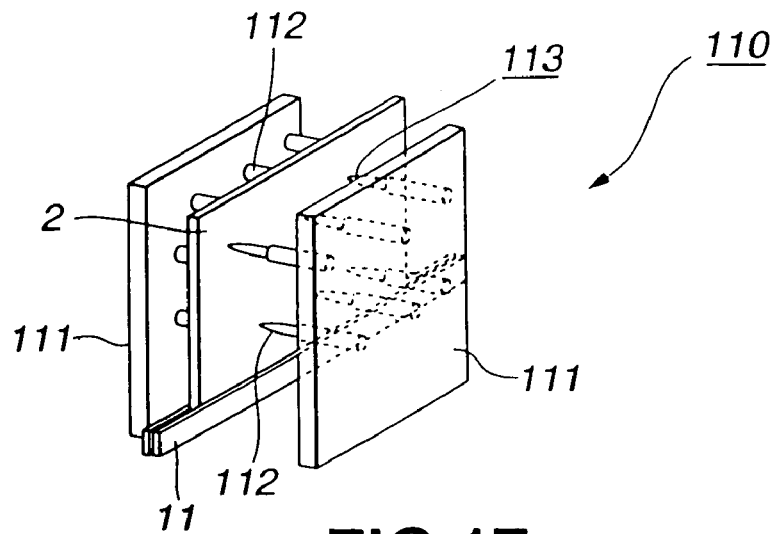
FIG. 17 is a perspective view of the electrical-continuity testing unit, showing the testing by the testing unit.

It should be reminded that the driving mechanism 14 can be used in an electrical-continuity testing unit 110 for testing the electrical continuity of a wiring pattern formed on the printed wiring board 2 as shown in FIG. 17. More specifically, the continuity testing unit 110 includes, in place of the aforementioned screen mechanism 12, a testing mechanism 113 having a support plate 111 and a plurality of testing pins 112 provided on the support plate 11 correspondingly to a wiring pattern formed on the printed wiring board 2 as shown in FIG. 17. The testing mechanism 113 is moved by the aforementioned driving mechanism 14 towards and away from the printed wiring board 2 supported in the transfer mechanism 11. When making an electrical-continuity test on the printed wiring board 2, the testing mechanism 113 is moved by the driving mechanism 14 towards the printed wiring board 2 supported by the transfer mechanism 11 and to a position off the carrying pin 28 which carries the printed wiring board 2. Since the printed wiring board 2 is applied with the same pressure from either side thereof when it is carried with the driving mechanism 14 for the electrical-continuity test thereof, so it can be prevented from being inclined during the test.

Next, the placing unit 4 to place electronic parts onto the printed wiring board 2 having cream solder printed by the aforementioned printer 3 on the lands thereof will be described below with reference to FIGS. 18 to 32.

As shown, the placing unit 4 includes transfer mechanisms 121a to 121d to carry the printed wiring board 2 while keeping it in generally upright position, and placing mechanisms 122a to 122h to place electronic parts 10 onto the printed wiring board 2. The placing mechanisms 122a, 122c, 122e and 122g and placing mechanisms 122b, 122d, 122f and 122h are disposed opposite to each other, respectively, across the transfer mechanism 121. The placing mechanisms 122a and 122b are controlled by a controller 123a, placing mechanisms 122c and 122d are by a controller 123b, placing mechanisms 122e and 122f are by a controller 123c, and the placing mechanisms 122g and 122h are by a controller 123d. The placing mechanisms 122a to 122d are provided to place electronic parts of standard sizes onto the printed wiring board 2, while the placing mechanisms 122e to 122h are provided to place electronic parts larger than the standard-size ones. Further, the placing unit 4 is controlled as a whole by a system controller 124.

The system controller 124 has stored therein positions where electronic parts to be placed by the placing mechanisms 122a to 122h and supplies placing-post data to each of the controllers 123a to 123d. Also, the system controller 124 is supplied with land-position data on land positions on the printed wiring board 2, generated by the detecting mechanism 38 included in the transfer mechanism 11 of the printer 3, from the controller 15 of the printer 3. That is, the land-position data indicates land positions involving the inclination of the printed wiring board 2 carried by the transfer mechanisms 121a to 121d. As will be described later, since the printed wiring board 2 is carried with the carrying pin 136 engaged in engagement holes 6a and 6b as in the conveyance by the conveying 11 of the printer 3 of the printed wiring board 2 with the carrying pin 28 engaged in the engagement hole 6b, so the placing unit 4 can use land-position data generated during conveyance of the printed wiring board 2 in the printer 3.

The controllers 123a to 123d control the placing mechanisms 122a to 122h based on the placing-post data supplied from the system controller 124. The controller 123a to control the placing mechanisms 122a and 122b disposed most upstream of the transfer mechanism 121 is supplied with the land-position data from the system controller 124. The controller 123a supplies the land-position data to the placing mechanisms 122a and 122b for control of the latter. More particularly, the placing mechanisms 122a and 122b are controlled correspondingly to an inclination or the like of the printed wiring board 2 supported thereby.

The controller 123a supplies the land-position data to the controller 123b as the printed wiring board 2 is being carried. Thereafter, the land-position data is transferred to the controller 123c and then to the controller 123d. Each of these controllers 123a to 123d controls the placing mechanisms 122a to 122h correspondingly to a posture of the printed wiring board 2 being carried on the basis of the land-position data.

Figure 19:
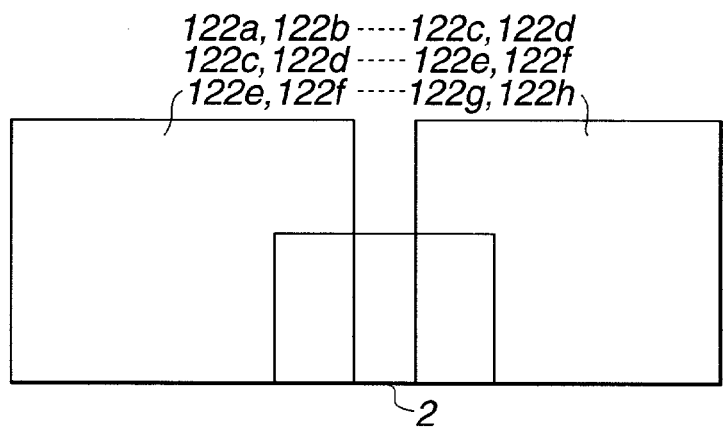
FIG. 19 is a side elevation of the placing units, showing the printed wiring board being over between the neighboring pairs of placing units.

In the placing unit 4, when the printed wiring board 2 stays over between the neighboring pairs of placing mechanisms 122a and 122b and neighboring placing mechanisms 122c and 122d, between the neighboring pairs of placing mechanisms 122c and 122d and neighboring placing mechanisms 122e and 122f, or between the neighboring pairs of placing mechanisms 122e and 122f and neighboring placing mechanisms 122g and 122h as shown in FIG. 19, both the neighboring pairs of placing mechanisms are used to place an electronic part in order to attain a higher efficiency of mounting. At this time, the downstream placing mechanisms are controlled by the controller which controls the upstream placing mechanisms.

Figure 20:
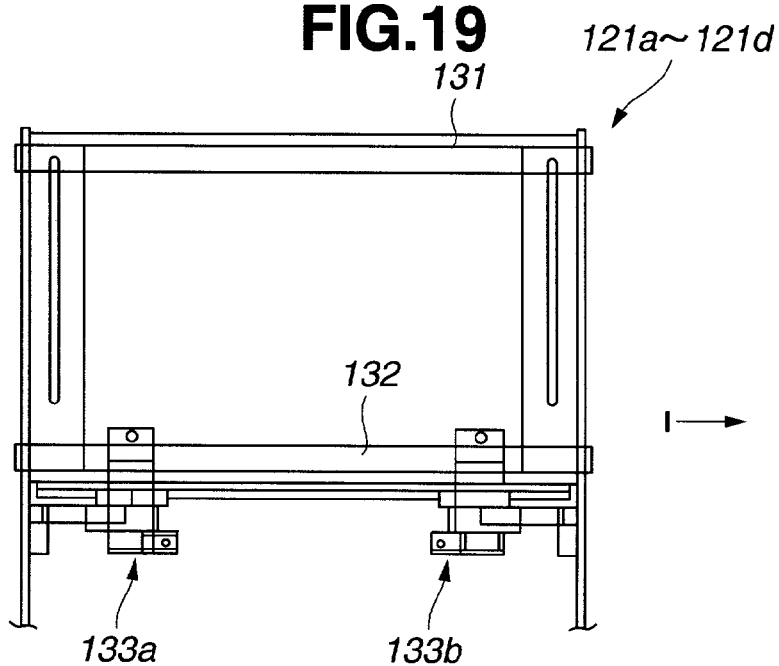
FIG. 20 is a plan view of the transfer mechanism included in the placing unit.
Figure 21:
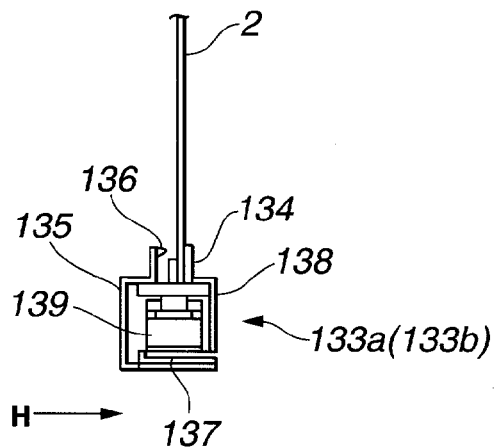
FIG. 21 is a side elevation of the carrying block included in the transfer mechanism.

As shown in FIGS. 20 and 21, each of the transfer mechanisms 121a to 121d of the placing unit 4 operative in the aforementioned system includes a pair of guide rails 131 and 132 which engage and support the opposite lateral edges of the generally rectangular printed wiring board 2. The lower guide rail 132 shown in the lower portion of FIG. 20 has carrying blocks 133 to carry the printed wiring board 2. As shown in FIG. 21, each of the carrying blocks 133 includes a support member 134 to support the printed wiring board 2 at one side of the latter, and a carrying member 135 which works with the support member 134 to hold the printed wiring board 2 between them. Between the support member 134 and carrying member 135, there is provided a rail member 138 forming a part of the guide rail 132. Also, the carrying member 135 is also provided with a carrying pin 136 which is to be engaged in the engagement holes 6a and 6b formed in the printed wiring board 2. The carrying pin 136 is moved by a cylinder mechanism 137 in the direction of arrow H and opposite direction in FIG. 21, namely, towards and away from the support member 134. When conveying the printed wiring board 2, the carrying member 135 is moved in the direction of arrow H in FIG. 21, namely, towards the support member 134, to engage the carrying pin 136 into the engagement holes 6a and 6b. The support member 134 is further provided with a driving mechanism 139 to move the support member 134 in the direction of arrow I in FIG. 20 in which the printed wiring board 2 is to be carried. Thus the printed wiring board 2 is carried by the support member 134 and carrying member 135 being moved along with the driving mechanism 139 in the direction of arrow I in FIG. 20.

Note that the carrying blocks 133 are provided in two places, upstream (133a) and downstream (133b), on the guide rail 132.

Figure 22A:
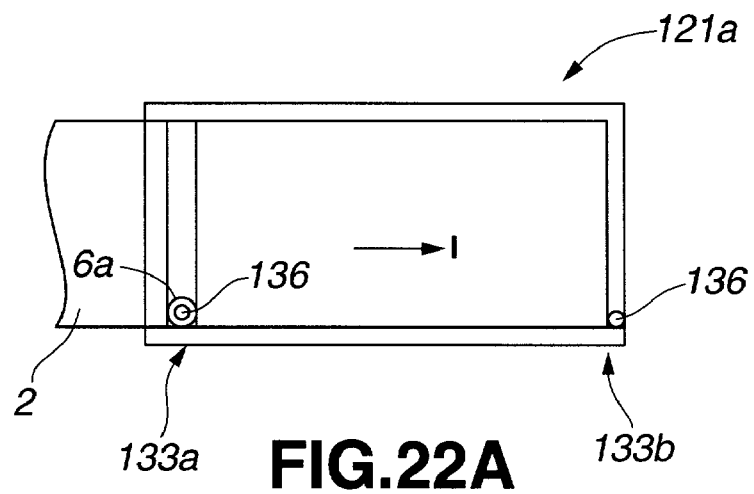
FIGS. 22A to 22C are plan views of the transfer mechanism, showing the operations of the mechanism in the operating order.

In the placing unit 4, the printed wiring board 2 is carried in relay by the transfer mechanisms 121a, 121b, 121c and 121d in this order. More specifically, when the printed wiring board 2 is set in between the guide rails 131 and 132 from the transfer mechanism 11 of the printer 3, first the carrying member 135 of the upstream carrying block 133a in the transfer mechanism 121a is moved in the direction of arrow H in FIG. 21, namely, towards the support member 134, and the carrying pin 136 is engaged into the engagement hole 6a located downstream in the carrying direction, as shown in FIG. 22A. Then, the carrying block 133 is driven by the driving mechanism 139 to carry, by towing, the printed wiring board 2 to a position where an electronic part is to be held, for placement, by the most upstream pair of placing mechanisms 122a and 122b. Here, an electronic part is placed in a predetermined position on the printed wiring board 2 by the pair of placing mechanisms 122a and 22b.

Figure 22B:
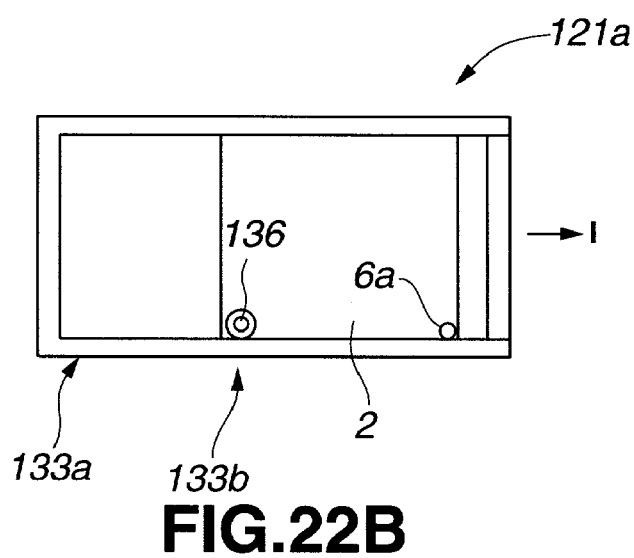
Figure 22C:
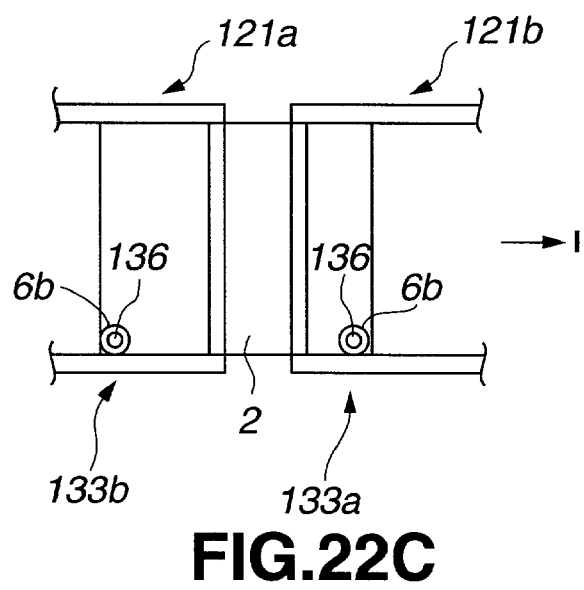

Next, the upstream carrying block 133a carries, by towing, the printed wiring board 2 in the direction of arrow I in FIGS. 22A to 22C. As shown in FIG. 22B, the carrying member 135 of the upstream carrying block 133a is moved in the direction opposite to the direction of arrow H in FIG. 21, namely, away from the support member 134, and the carrying pin 136 is disengaged from the engagement hole 6a. Instead, the carrying member 135 of the downstream carrying block 133b on the guide rail 132 is moved in the direction of arrow H in FIG. 21, namely, towards the support member 134, and the carrying pin 136 is engaged into the engagement hole 6b. Note that at this time, the upstream carrying block 133a is moved upstream, namely, in the direction opposite to the direction of arrow H in FIGS. 22A to 22C to carry a next printed wiring board 2.

Then, the downstream carrying block 133b on the guide rail 132 is driven by the driving mechanism 139 to carry, by pushing, the printed wiring board to a next placing post. This placing post is a position where the printed wiring board 2 stays over between the most upstream pair of placing mechanisms 122a and 122b and neighboring pair of placing mechanisms 122c and 122d as shown in FIG. 22C. In this position, electronic parts are placed in a predetermined position on the printed wiring board 2 by the downstream pair of placing mechanisms 122c and 122d and neighboring pair of placing mechanisms 122a and 122b. Thus, in the placing unit 5, electronic parts can be placed at the same time on the printed wiring board 2 by the four placing mechanisms 122a to 122d, where leads to an improved efficiency of electronic part mounting. At this time, the upstream placing mechanisms 122a and 122b are controlled by the controller 123b for the downstream placing mechanisms 122c and 122d.

Thereafter, the downstream carrying block 133b carries, by pushing, the printed wiring board 2 in the direction of arrow I in FIGS. 22A to 22C. Then, the carrying member 135 of the downstream carrying block 133b is moved in the direction opposite to the direction of arrow H in FIG. 21, namely, away from the support member 134, and the carrying pin 136 is disengaged from the engagement hole 6b. Instead, the carrying member 135 of the upstream carrying block 133a on the guide rail 132 included in the next transfer mechanism 121b is moved in the direction of arrow H in FIG. 21, that is, towards the support member 134, to engage the carrying pin 136 into the engagement hole 6a. Then, the state shown in FIG. 22C is attained, and hereafter, the printed wiring board 2 is carried by the transfer mechanisms 121b to 121d in this order.

Figure 23:
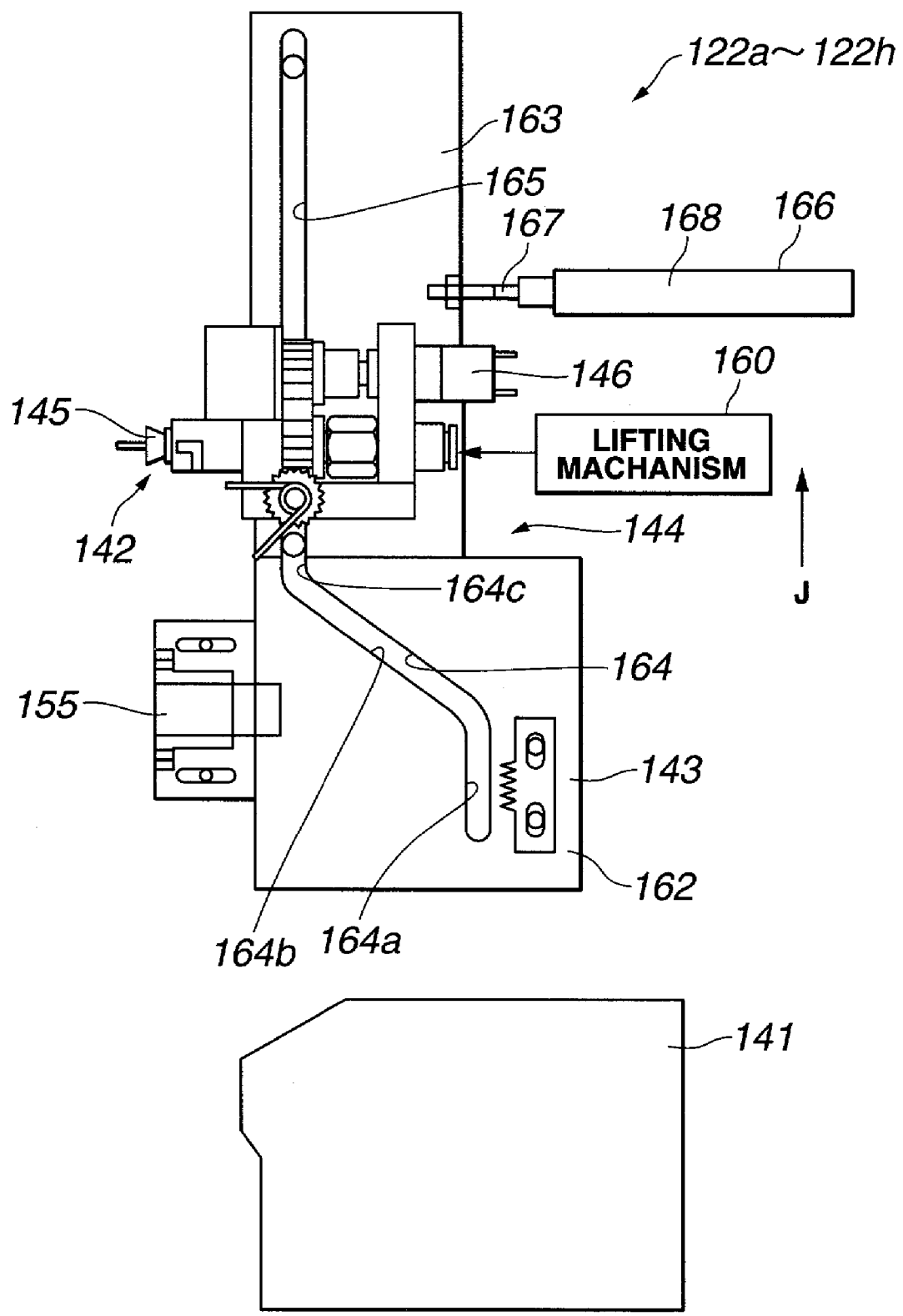
FIG. 23 is a side elevation of the placing mechanism.
Figure 24:
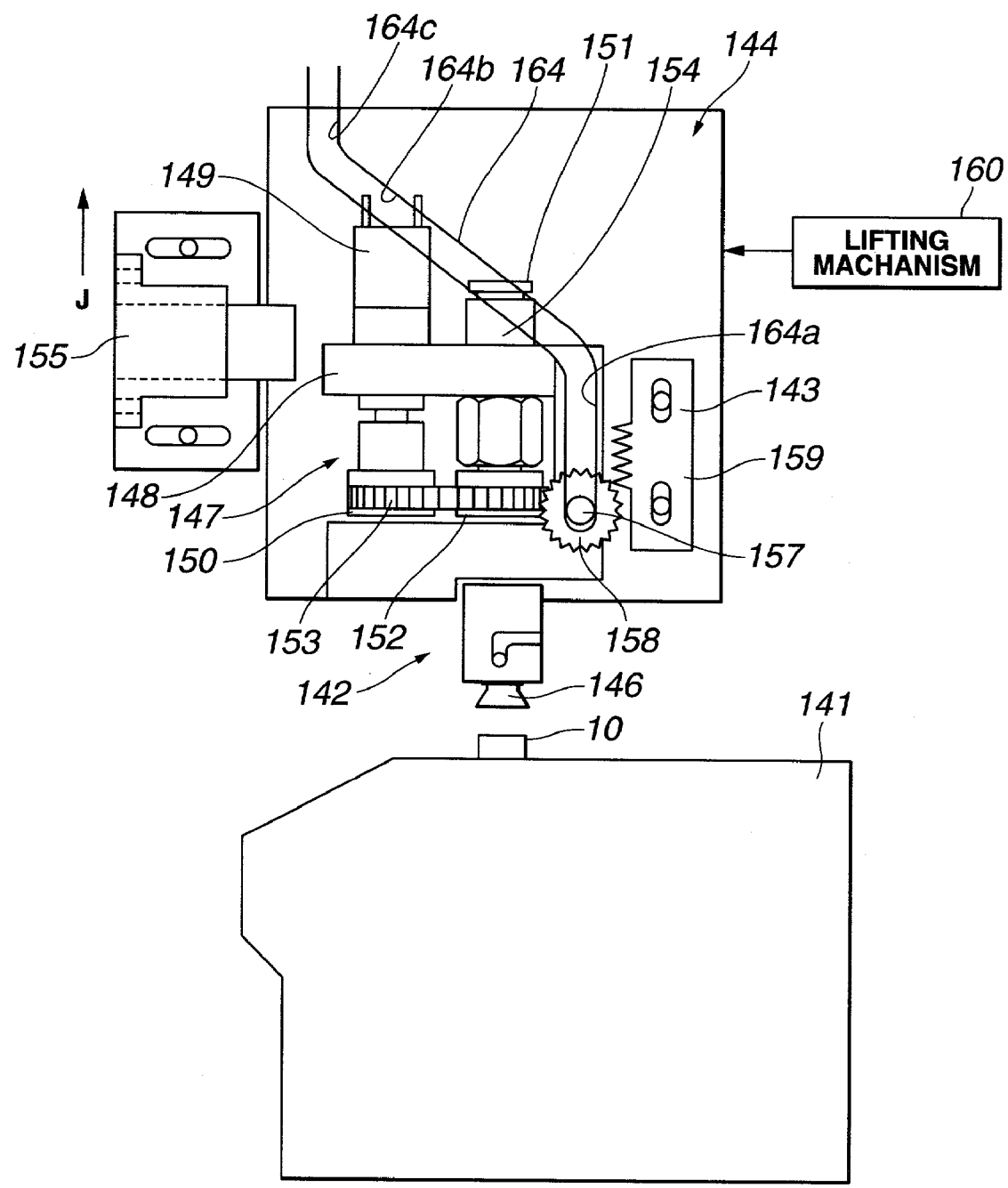
FIG. 24 is a plan view of the part holding mechanism, showing an electronic part held in the part feeder.

The placing mechanisms 122a to 122h disposed across the transfer mechanisms 121a to 121d are constructed as shown in FIG. 23. Note that since the placing mechanisms 122a to 122d are constructed similarly to each other, they will generically be referred to as "placing mechanism 122" hereunder. As shown in FIGS. 23 and 24, the placing mechanism 122 includes a part holding mechanism 142 to hold, by suction, an electronic part 10 supplied from a part feeder 141, a turning mechanism 143 to shuttle the part holding mechanism 142 between two positions, namely, a first position in which the electronic part 10 supplied from the part feeder 141 is held by suction and a second position where it is opposite to the printed wiring board 2 supported by the transfer mechanisms 121a to 121d, and a guide mechanism 144 to guide the up-down movement of the part holding mechanism 142 in the second position. The part feeder 141 is provided to supply electronic parts 10 of a standard size.

As shown in FIGS. 24 and 25, the part holding mechanism 142 has a suction head 146 to hold, by suction, an electronic part 10. The suction head 146 is connected to a suction pump (not shown) and holds, by suction, the electronic parts 10 while transferring it from the part feeder 141 to the printed wiring board 2. Note that the part holding mechanism 142 is moved up and down by a lifting mechanism 160 in the direction of arrow J and opposite direction in FIG. 23, which will not be described any longer.

Further, the part holding mechanism 142 has an adjusting mechanism 147 to adjust the held state of the electronic part 10 caught by the suction head 146 as shown in FIGS. 24, 26 and 27. The adjusting mechanism 147 includes a drive motor 149 fixed to a generally L-shaped fixture 148, a first pulley 150 fixed to the output shaft of the drive motor 149, a second pulley 152 fixed to a shaft 151 to which the suction head 146 is installed, en endless belt 153 to provide a ling between the first and second pulleys 150 and 152, and a shaft support 154 to support the shaft 151 rotatably.

A detector 155 using a CCD (charge-coupled device) element is provided in a position where it will be opposite to the electronic part 10 when the suction head 146 stays in the second position where the electronic part 10 is opposite to the printed wiring board 2 supported by the transfer mechanisms 121a to 121d. When it is judged by the detector 155 that the electronic part 10 sucked and held by the suction head 146 is inclined, the drive motor 149 is put into action to rotate the shaft 151 for adjustment of the held state of the electronic part 10.

Figure 28:
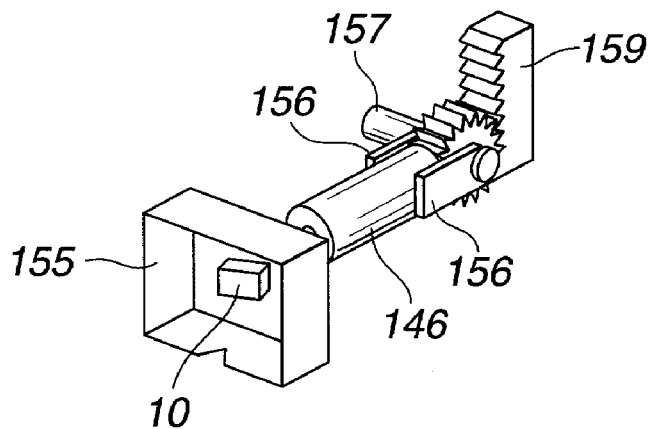
FIG. 28 is a perspective view of the part holding mechanism in the second position.
Figure 29:
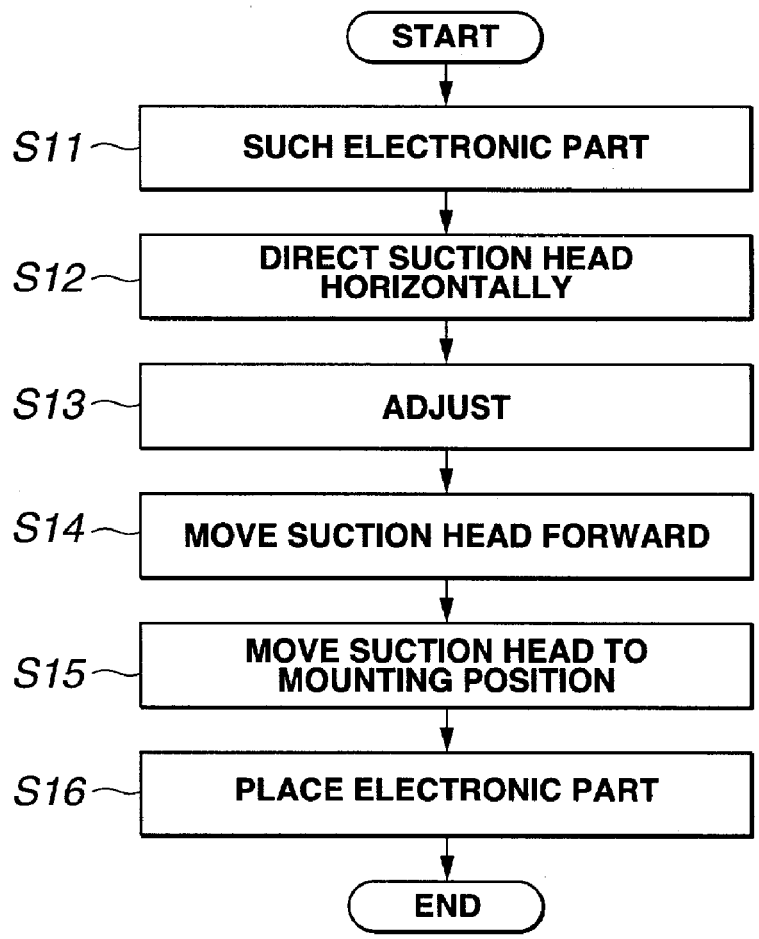
FIG. 29 shows a flow of operations of the placing mechanism.

The turning mechanism 143 shuttles the above-mentioned part holding mechanism 142 between the first position in which the electronic part 10 supplied from the part feeder 141 is held by suction and second position where it is opposite to the printed wiring board 2 supported by the transfer mechanisms 121a to 121d. The turning mechanism 143 includes, as shown in FIGS. 24, 27 and 28, a spindle 157 inserted through a pair of support pieces 156 which support the suction head 146 and a gear 158 fixed to the spindle 157 and between the support pieces 156, the spindle 157 and gear 158 being included in the part holding mechanism 142, and a rack 159 having a toothed portion formed along the up-down moving direction of the part holding mechanism 142 and fixed to the cabinet.

When the part holding mechanism 142 is moved up by the lifting mechanism 160 in the direction of arrow J in FIG. 24, the gear 158 is engaged with the rack 159 and the part holding mechanism 142 is further moved up. The part holding mechanism 142 is turned about 90° about the spindle 157 as shown in FIGS. 27 and 28. Thus, the part holding mechanism 142 is shifted from the first position to the second position. In the second position, the held state of the electronic part 10 sucked and held by the suction hear 146 is detected by the detector 155. When it is judged by the detector 155 that the electronic part 10 sucked and held by the suction head 146 is inclined, the drive motor 149 is put into action to rotate the shaft 151, thereby adjusting the held state of the electronic part 10.

As shown in FIG. 23, the guide mechanism 144 to guide the up-down movement of the part holding mechanism 142 in the second position includes first and second guide members 162 and 163. The first guide member 162 is disposed above the second guide member 163, and has a guide slot 164. The guide slot 164 consists of a first straight portion 164a to engage the gear 158 with the rack 159 of the above-mentioned turning mechanism 143, an inclined portion 164b formed contiguously to the first straight portion 164a and obliquely in the transfer mechanisms 121a to 121d of the first guide member 162, and a second straight portion 164c formed contiguously to the inclined portion 164b and in parallel to the first straight portion 164a on the side of the transfer mechanisms 121a to 121d. The second guide member 163 has a driving mechanism 166 to move the electronic part 10 towards the printed wiring board 2 for placement on the latter. The driving mechanism 166 is a cylinder mechanism to move the second guide member 163 in the up-down moving direction of the part holding mechanism 142, that is, in a direction generally perpendicular to the direction of arrow J and opposite direction in FIG. 23, and includes a shaft 167 and cylinder 168 fixed to the second guide member 163. When the part holding mechanism 142 has moved the guide slot 165, the second guide member 163 move in the direction of arrow J in FIG. 23 towards the printed wiring board 2 in relation to the first guide member 162. The second guide member 163 is thus moved by the driving mechanism 166 in the direction of arrow J in FIG. 23, and the suction head 146 places the electronic part 10 held thereby on the printed wiring board 2. The shaft 151 of the part holding mechanism 142 is engaged in the guide slots 164 and 165.

As shown in FIGS. 26A and 26B, the part holding mechanism 142 has provided thereon an extension spring 169 to keep it in the second position by means of the turning mechanism 143. The extension spring 169 is engaged at one end thereof on the fixture 148 and at the other end on the suction head 146. The extension spring 169 pulls the suction head 146 towards the fixture 148 to hold the part holding mechanism 142 in the second position as shown in FIG. 26B.

The placing mechanism 122 constructed as in the above works when the above-mentioned transfer mechanisms 121a to 121d are in the position where the electronic part 10 is placed onto the printed wiring board 2. A series of operations for placement of the electronic part 10 onto the printed wiring board 2 will be discussed herebelow with reference to FIG. 29. In step S11, for holding the electronic part 10 supplied from the part feeder 141, the suction head 146 has been lowered by the lofting mechanism 160 as shown in FIG. 24 in the direction opposite to the direction of arrow J in FIG. 23 and the gear 158 is not engaged with the rack 159. That is, the suction head 146 is forced to the first position, namely, to a position opposite to the part feeder 141, under the action of the extension spring 169 as shown in FIG. 26A. In this first position, the suction head 146 will suck and hold the electronic part 10 supplied from the part feeder 141.

In step S12, the lifting mechanism 160 is put into operation, the part holding mechanism 142 is lifted in the direction of arrow J in FIG. 23 while the spindle 157 is being guided by the first straight portion 164a of the guide slot 164 in the first guide member 162, the gear 158 is engaged with the rack 159, and thus the part holding mechanism 142 is further lifted in the same direction. Thus, the part holding mechanism 142 is turned about 90° about the spindle 157. In this way, the part holding mechanism 142 is shifted from the first position to the second position as shown in FIG. 27. The suction head 146 is held in the second position, namely, in the position opposite to the detector 155, as shown in FIG. 26B under the action of the extension spring 169.

In step S13, the detector 155 detects the held state of the electronic part 10 sucked and held by the suction head 146. When it is judged by the detector 155 that the electronic part 10 sucked and held by the suction head 146 is inclined, the drive motor 149 is put into action to rotate the shaft 151, thereby adjusting the held state of the electronic part 10.

Thereafter in step S14, the lifting mechanism 160 is driven to lift up the part holding mechanism 142 in the direction of arrow J in FIG. 23 up to the height of the second guide member 163. Namely, the spindle 157 is shifted from the first straight portion 164a to the second straight portion 164c via the inclined portion 164b and thus the suction head 146 is moved to near the transfer mechanisms 121a to 121d.

As the suction head 146 is lifted by the lifting mechanism 160, the spindle 157 is moved to the guide slot 165 in the second guide member 163. In step S15, the lifting mechanism 160 is stopped at the height where the electronic part 10 is placed onto the printed wiring board 2 based on mounting-position data and land-position data.

In step S16, the second guide member 163 is moved in the direction of arrow K in FIG. 23 towards the printed wiring board 2 in relation to the first guide member 162 as shown in FIG. 23. That is, the second guide member 163 is moved by the driving mechanism 166 in the direction of arrow K in FIG. 23 to allow the suction head 146 to place the electronic part 10 on the printed wiring board 2.

Figure 30:
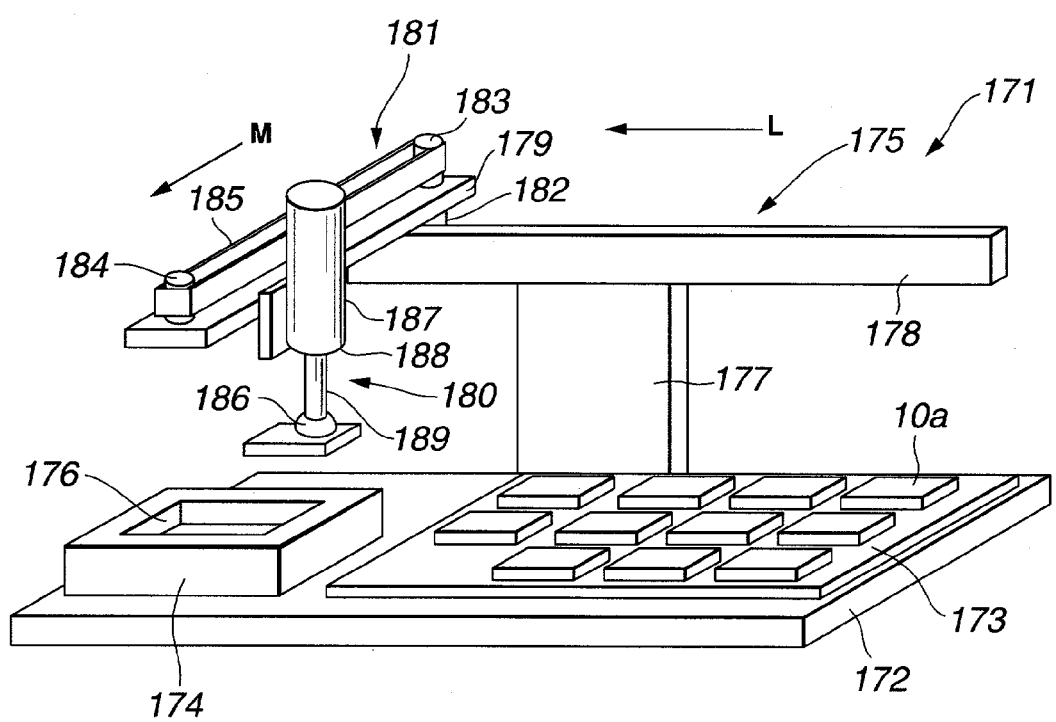
FIG. 30 is a perspective view of the part feeding mechanism which feeds large electronic parts to the placing mechanism.

As having previously been described, the placing mechanisms 122e to 122h are provided to place larger electronic parts than the standard-size electronic parts. For handling such a larger-size electronic part 10a, there is used a part feeding mechanism 171 different from the aforementioned part feeder 141. As shown in FIG. 30, the part feeding mechanism 171 includes a base plate 172 having provided thereon a tray 173 on which large electronic parts 10a are placed side by side and a positioning member 174 which provisionally position the electronic parts 10a before held by the aforementioned part holding mechanism 142. The part feeding mechanism 171 has provided thereon a transfer mechanism 175 which transfers an electronic part 10a from on the tray 173 to the positioning member 174. The positioning member 174 has formed therein a positioning concavity 176 having a shape corresponding to those of the electronic parts 10a placed on the tray 173. Since the electronic part 10a is pre-positioned in the positioning concavity 176 before being sucked by the suction head 146 of the part holding mechanism 142, so that the electronic part 10a can be accurately held, by suction, by the suction head 146.

The transfer mechanism 175 to transfer the electronic part 10a from on the tray 173 to the positioning member 174 includes a guide rail 178 mounted on a support plate 177 fixed to the base plate 172 in parallel to the array of the tray 173 and positioning member 174, a transfer member 179 installed generally perpendicularly to, and movably along, the guide rail 178, and a holding mechanism 180 fixed to the transfer member 179 to hold the electronic part 10a on the tray 173. The transfer member 179 is engaged at one end thereof on the guide rail 178, and the transfer member 179 is moved by a driving mechanism (not shown) in the direction of arrow L and opposite direction in FIG. 30. The transfer member 179 has a moving mechanism 181 which moves the holding mechanism 180 in the direction of arrow M and opposite direction in FIG. 30, namely, perpendicularly to the guide rail 178. The moving mechanism 181 includes a drive motor 182, rollers 183 and 184 pivoted to opposite ends of the transfer member 179, and an endless belt 185 extended between and on the rollers 183 and 184. The roller 183 is connected to the output shaft of the drive motor 182. The holding mechanism 180 is connected to the endless belt 185. In the transfer mechanism 181, when the drive motor 182 is put into action, the endless belt 185 runs to move the holding mechanism 180 in the direction of arrow M and opposite direction in FIG. 30.

The holding mechanism 180 to hold, by suction, the electronic part 10a includes a suction head 186 to suck and hold the electronic part 10a, and a lifting mechanism 187 to move up and down the suction head 186. The suction head 186 is connected to a suction pump (not shown). The lifting mechanism 187 includes a cylinder 188 and shaft 189. The shaft 189 has the suction head 186 fixed to one end thereof. For sucking and holding the electronic part 10a, the lifting mechanism 187 lowers the suction head 186.

The part feeding mechanism 171 constructed as in the above operates as will be described below. First, the base plate 172 has disposed thereon the tray 173 on which the electronic parts 10a are placed. The transfer member 179 is moved along the guide rail 178 in the direction opposite to the direction of arrow L in FIG. 30. For catching the electronic part 10a, the moving mechanism 181 is put into action to move the holding mechanism 180 in the direction of arrow M in FIG. 30 to a predetermined position. Next, in the lifting mechanism 187, the suction head 186 sucks and holds the electronic part 10a, and then is moved up. Then, the transfer member 179 is moved by the driving mechanism (not shown) along the guide rail 178 in the direction of arrow L in FIG. 30. The moving mechanism 181 is put into action to move the holding mechanism 180 in the direction of arrow M in FIG. 30 to above the positioning member 174. The suction head 186 is lowered by the lifting mechanism 187 to place the electronic part 10a into the positioning concavity 176 in the positioning member 174. Thereafter, the electronic part 10a is placed by the aforementioned placing mechanisms 122e to 122h onto the printed wiring board 2 supported by the transfer mechanism 121.

Figure 31:
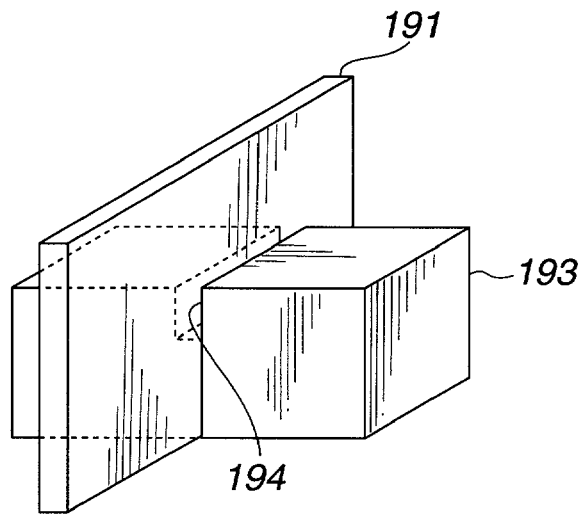
FIG. 31 is a perspective view of the placing mechanism, showing the positioning by the placing mechanism.

Note that as shown in FIG. 31, in the placing mechanisms 122a to 122h provided across the transfer mechanisms 121a to 121d, a positioning plate 191 is included in each placing mechanism 122 and engaged in a positioning recess 194 formed in a base block 193 also provided in the placing unit 4. Thus, each placing mechanism 122 can be prevented from being displaced when an external force is applied, and so an electronic part can be placed positively.

Figure 32:
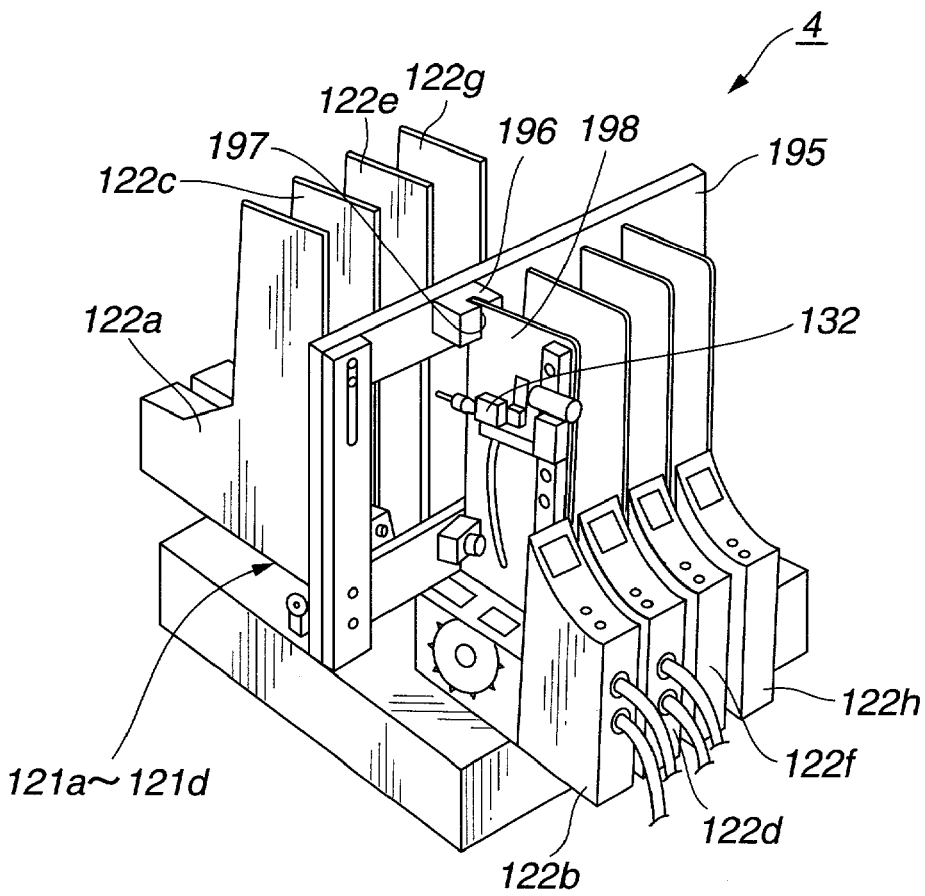
FIG. 32 is a perspective view of the placing mechanism, showing the entire construction of the latter.

As shown in FIG. 32, each of the placing mechanisms 122a to 122h is fixed with a fixing member 196 to a mount plate 195 provided in parallel to the transfer mechanisms 121a to 121d. The fixing member 196 has a fixing recess 197 formed therein. Each of the placing mechanisms 122a to 122h can easily be installed to the mount plate 195 by engaging, in the fixing recess 197, a fixing plate 198 fixed to each of the placing mechanisms 122a to 122h.

Next, the placing unit 4 constructed as having been described in the foregoing functions as will be described below. In the placing unit 4, the printed wiring board 2 is carried in relay by the transfer mechanisms 121a, 121b, 121c and 121d in this order. More specifically, when the printed wiring board 2 is brought by the transfer mechanism 11 of the printer 3 into between the guide rails 131 and 132, first the carrying block 133 is driven by the driving mechanism 139 to carry, by towing, the printed wiring board 2 to a placing post of the most upstream pair of placing mechanisms 122a and 122b as shown in FIG. 22A. Here, an electronic part is placed in a predetermined position on the printed wiring board 2 by the pair of placing mechanisms 122a and 22b.

At this time, the suction head 146 stays in a position opposite to the part feeder 141 and where it will hold, by suction, the electronic part 10 supplied from the part feeder 141. Next, the part holding mechanism 142 is lifted up in the direction of arrow J in FIG. 23 with the spindle 157 thereof being guided along the first straight portion 164a of the guide slot 164 in the first guide member 162. Then, the rack 159 is engaged with the gear 158, and the part holding mechanism 142 is further lifted up in the same direction and thus turned about 90° about the spindle 157 as shown in FIGS. 27 and 28. Thereby, the part holding mechanism 142 is shifted from the first to second position as shown in FIG. 27. Now the detector 155 detects the held state of the electronic part 10 sucked and held by the suction head 146. When the result of detection from the detector 155 is that the electronic part 10 sucked and held by the suction head 146 is inclined, the drive motor 149 is put into action to rotate the shaft 151 for adjustment of the held state of the electronic part 10. Thereafter, the part holding mechanism 142 is further elevated in the direction of arrow J in FIG. 23 up to the position of the second guide member 163. Moreover, the suction head 146 is elevated by the lifting mechanism 160, the spindle 157 is moved to the guide slot 165 in the second member 163 and the part holding mechanism 142 is stopped at a higher where the electronic part 10 is placed onto the printed wiring board 2. As shown in FIG. 23, the second guide member 163 is moved in the direction of arrow K in FIG. 23 towards the printed wiring board 2 with respect to the first guide member 162. Then the second guide member 163 is moved by the driving mechanism 166 in the direction of arrow K in FIG. 23 to allow the suction head 146 to place the electronic part 10 onto the printed wiring board 2.

Note that the pair of placing mechanisms 122a and 122b is controlled by the controller 123a, the pair of placing mechanisms 122c and 122d is controlled by the controller 123b, the pair of placing mechanisms 122e and 122f is controlled by the controller 123c, and the pair of placing mechanisms 122g and 122h is controlled by the controller 123d.

When the placement of the electronic part 10 is complete, the upstream carrying block 133a will carry, by towing, the printed wiring board 2 in the direction of arrow I in FIG. 22. At this time, the carrying member 135 of the upstream carrying block 133a is moved away from the support member 134 and thus the carrying pin 136 is disengaged from the engagement hole 6a, as shown in FIG. 22B. Instead, the carrying member 135 of the downstream carrying block 133b on the guide rail 132 is moved towards the support member 134 and so the carrying pin 136 is engaged into the engagement hole 6b located upstream in the carrying direction.

Next, the downstream carrying block 133 on the guide rail 132 carries, by pushing, the printed wiring board 2 to a next placing post. As shown in FIGS. 19 and 22C, in this the placing post, the printed wiring board 2 is over the most upstream placing mechanisms 122a and 112b and next placing mechanisms 122c and 122d. As having been described in the foregoing, the electronic part is placed in a predetermined on the printed wiring board 2 by the downstream placing mechanisms 122c and 122d and upstream placing mechanisms 122a and 122b. Note that when the printed wiring board 2 is in a position over the upstream pair of placing mechanisms 122a and 122b and next pair of placing mechanisms 122c and 122d, both these pairs of placing mechanisms are used to place electronic parts onto the printed wiring board 2 by both the pairs of placing mechanisms in order to attain an improved efficiency of electronics packaging. At this time, the downstream pair of placing mechanisms will be controlled by the controller which controls the upstream pair of placing mechanisms.

Figure 18:
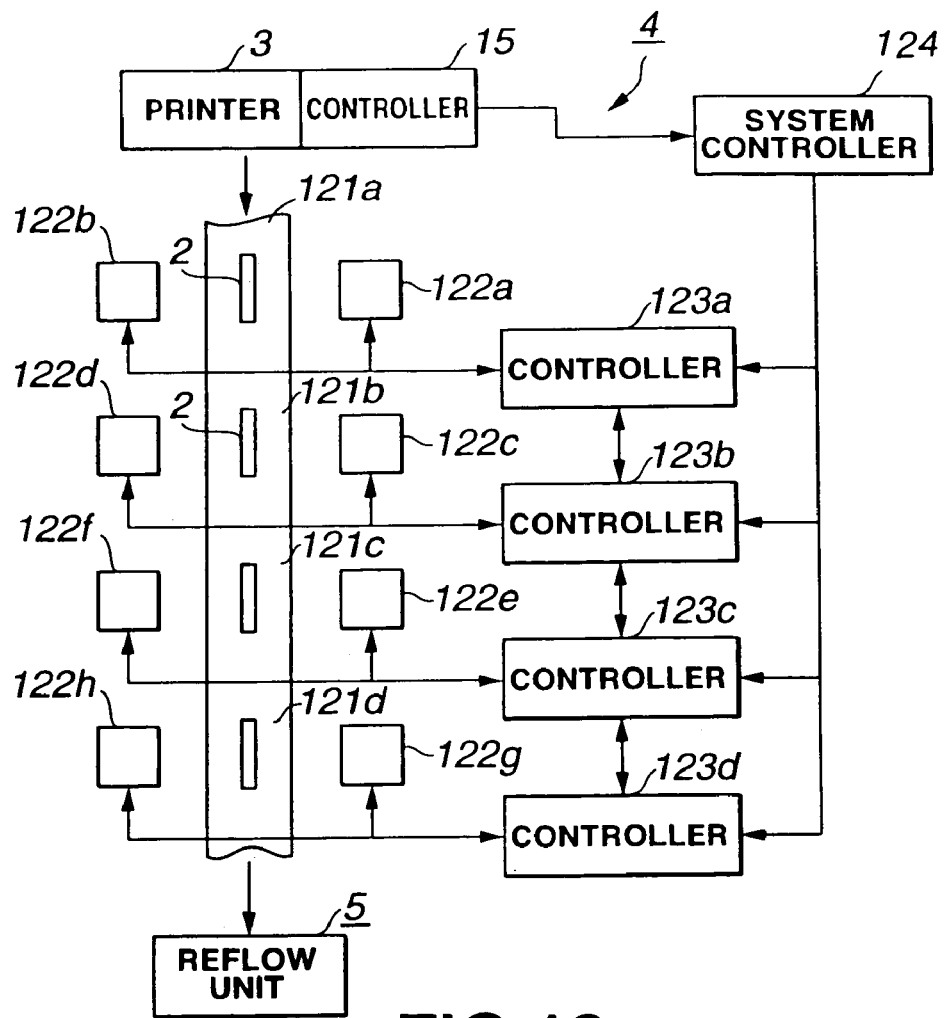
FIG. 18 is a block diagram of the placing unit.

In the above placing unit 4, since the printed wiring board 2 is supported in upright position by the transfer mechanisms 121a to 121d, electronic parts 10 and 10a can be placed on respective sides of the printed wiring board 2 at the same time, which leads to a reduced time for electronics packaging and a smaller electronics packaging system than the conventional system in which electronic parts are mounted on each side of a printed wiring board in one pass. As shown in FIG. 18, in the placing unit 4, land-position data generated by the controller 15 in the printer 3 is supplied to the controller 123a in the placing mechanisms 122a and 122b via the system controller 124, and the data is supplied sequentially to the controllers 123b to 123d in this order to control the placing mechanisms 122a to 122h. Thus, it is not necessary to provide any land-position data detecting mechanism in the transfer mechanisms 121a to 121d, which contributes to a simplified construction of the electronics packaging system. When the printed wiring board 2 is in a position over the most upstream pair of placing mechanisms 122a dn 122b and next pair of placing mechanisms 122c and 122d, electronic parts 10 and 10a are placed in predetermined positions on the printed wiring board 2 by the upstream pair of placing mechanisms 122c and 122d and upstream pair of placing mechanisms 122a and 122b. Thus, it is possible to place electronic parts on the printed wiring board 2 at the same time by the four placing mechanisms 122a to 122d in the placing unit 4, which leads to an improved efficiency of electronics packaging.

Figure 33:
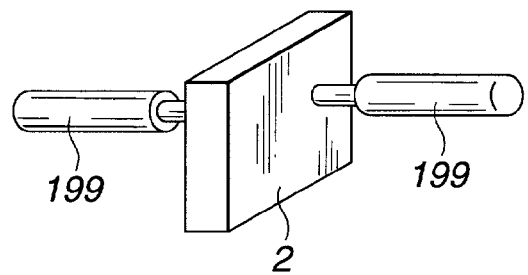
FIG. 33 is a perspective view of the adhesive applicator which applies adhesive to provisionally fix an electronic part to the printed wiring board.

As shown in FIG. 33, the above placing mechanism 122 can be made as an adhesive applicator by forming a part of the suction head 146 as an adhesive application mechanism 199 to provisionally secure electronic parts 10 and 10a in a transfer process from the placement of the electronic parts 10 and 10a on the printed wiring board 2 up to transfer of the printed wiring board 2 to the reflow unit 5. In this case, the adhesive application is disposed between the printer 3 and placing unit 4. Especially, combination of the adhesive application mechanism 199 with the above placing unit 4 permits to place larger-size electronic parts on either side of a printed wiring board at the same time.

Figure 34:
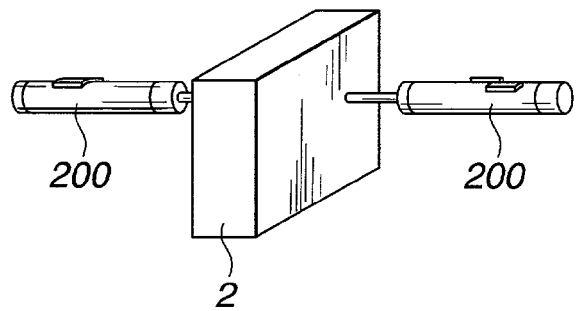
FIG. 34 is a perspective view of the part installer which screws an electronic part to the printed wiring board from either side of the latter.

As shown in FIG. 34, the suction head 146 may be constructed as a part fixing unit by forming a part of the suction head 146 as a screwing mechanism 200. Thereby, an electronic part can be screwed from either side of the printed wiring board (work), which also leads to an improved efficiency of electronics packaging.

Next, there will be described with reference to the accompanying drawings the reflow unit 5 to solder, to the printed wiring board 2, the electronic parts 10 and 10*a* once placed on the printed wiring board 2 by the above-mentioned placing unit 4 as in the above.

Figure 35:
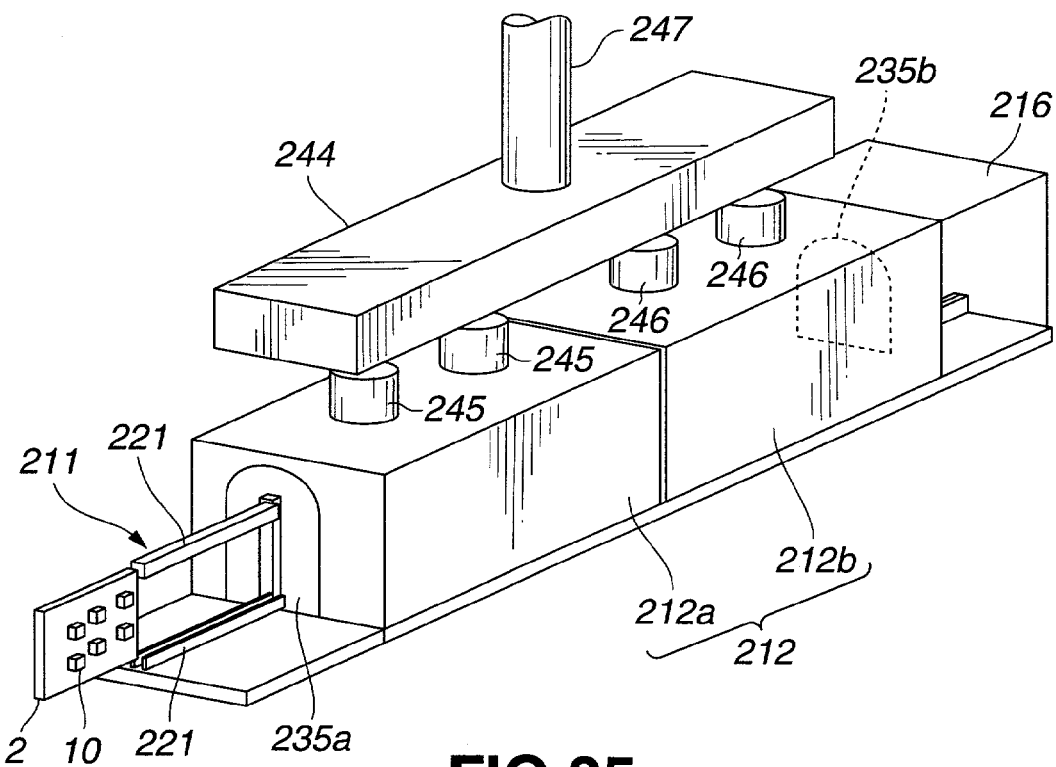
FIG. 35 is a perspective view of the reflow unit which solders an electronic part to the printed wiring board.

As shown in FIG. 35, the reflow unit 5 includes a transfer mechanism 211 to carry the printed wiring board 2 having cream solder printed on the lands thereof while being supported in generally upright position, a reflow furnace unit 212 to heat the printed wiring board 2 supported by the transfer mechanism 211 to melt the cream solder printed on the lands of the printed wiring board 2 by the printer 3, first and second heating mechanisms 213 and 214 provided opposite to respective sides of the printed wiring board 2 supported by the transfer mechanism 211, a third heating mechanism 215 provided inside the reflow furnace unit 212 to heat, from below, the printed wiring board 2 supported by the transfer mechanism 211, and a cooling block 216 to cool the melted cream solder on the lands of the printed wiring board 2.

Figure 36:
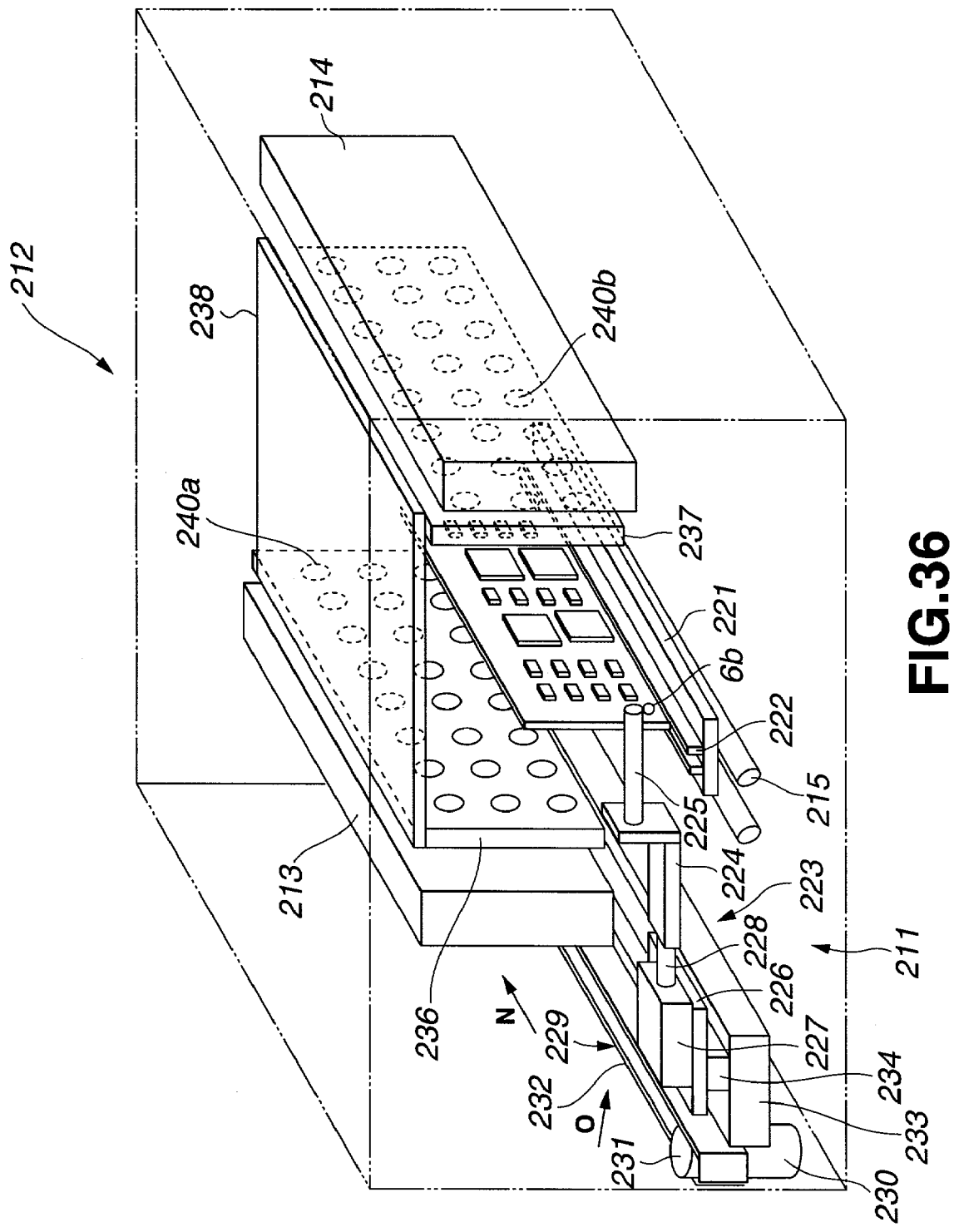
FIG. 36 is a perspective view of the reflow furnace unit, showing the internal construction.

As shown in FIG. 36, the transfer mechanism 211 to carry the printed wiring board 2 has guide members 221 provided in the direction in which the printed wiring board 2 is brought. As shown in FIG. 36, each of the guide members 221 has formed therein guide recess 222 directed in the direction of arrow N in FIG. 36 in which the printed wiring board 2 is to be carried and in which the upper and lower edges of the printed wiring board 2 are engaged and supported, respectively.

The transfer mechanism 211 has a carrying block 223 to carry the printed wiring board 2 as shown in FIG. 36. The carrying block 223 includes a carrying member 224 to carry the printed wiring board 2, a carrying pin 225 provided on the carrying member 224 for engagement in the engagement hole 6*b* formed in the printed wiring board 2. The carrying member 224 is connected to a cylinder mechanism 227 provided on a carrying-member guide member 226 which provides a guide for moving the carrying member 224 in the direction in which the printed wiring board 2 is to be brought. More particularly, the cylinder mechanism 227 has a shaft 228 fixed to the carrying member 224. The shaft 228 is engaged into, or disengaged from, the engagement hole 6*b* in the printed wiring board 2 by moving the carrying pin 225 in the direction of arrow O and opposite direction in FIG. 36. The carrying-member guide member 226 is moved by a driving mechanism 229 in the direction of arrow N in FIG. 36. The driving mechanism 228 includes a drive motor 230, and an endless belt 232 extended between and on a roller 231 fixed to the drive shaft of the drive motor 230 and a roller (not shown). The endless belt 232 has the carrying-member guide member 226 fixed thereto. Note that the carrying-member guide member 226 is guided on a rail member 234 on a guide member 233 provided in the direction in which the printed wiring board 2 is to be carried.

The transfer mechanism 211 constructed as in the above functions as will be described below. Before the printed wiring board 2 having electronic parts 10 and 10*a* placed thereon by the aforementioned placing unit 4 is introduced into the transfer mechanism 211, the carrying member 224 has been moved in the direction opposite to the direction of arrow N in FIG. 36 and the carrying pin 225 has been moved by the cylinder mechanism 227 in the direction opposite to the direction O in FIG. 36. When the printed wiring board 2 is put into the transfer mechanism 211, it is engaged at the lateral edges thereof in the guide recesses 222 in the guide members 221. The carrying pin 225 is moved by the cylinder mechanism 227 in the direction of arrow O in FIG. 36 and engaged into the engagement hole 6*b*. Then, the driving mechanism 229 is put into action to allow the endless belt 232 to run, whereby the carrying member 224 is moved in the direction of arrow N in FIG. 36 while being guided along the rail 234 on the guide member 233, to thereby carry the printed wiring board 2 engaged and supported in the guide recess 222 in the same direction as the direction of arrow N. The printed wiring board 2 is carried by the transfer mechanism 211 through the reflow furnace unit 212 and cooling block 216. For removing the printed wiring board 2 from the transfer mechanism 211, the carrying pin 225 is moved by the cylinder mechanism 227 in the direction opposite to the direction of arrow O in FIG. 36, disengaged from the engagement hole 6*b* and thus can be removed from the transfer mechanism 211.

The reflow furnace unit 212 provided to cover the aforementioned transfer mechanism 211 consists of a pre-heating reflow furnace 212*b* and a heating reflow furnace 212*b* disposed contiguously to and downstream of the pre-heating reflow furnace 212*a* as shown in FIG. 35. The pre-heating reflow furnace 212*a* has formed in one side thereof an inlet opening 235*a* through which the printed wiring board 2 is introduced, and the heating reflow furnace 212*b* has formed in one side thereof an outlet opening 235*b* through which the printed wiring board 2 is brought out. Note that these openings 235*a* and 235*b* may be provided each with a curtain for preventing the temperature in the reflow furnaces 212*a* and 212*b* from being lower.

Figure 37:
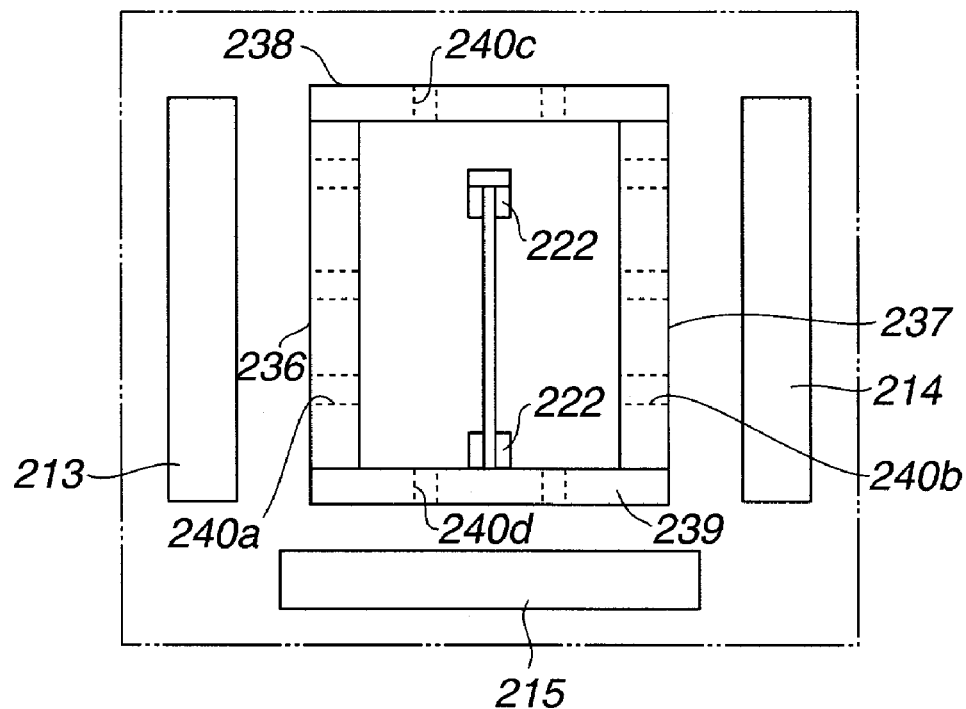
FIG. 37 is a sectional view of the reflow furnace unit.

As shown in FIGS. 36 and 37, each of the reflow furnaces 212*a* and 212*b* has the first to third heating mechanisms 213, 214 and 215 provided therein. The first and second heating mechanisms 213 and 214 are disposed to face each main side of the printed wiring board 2 being carried while being supported in generally upright position by the transfer mechanism 211. Each of the first and second heating mechanisms 213 and 214 includes a three-phase heater of 200 V, 20 A.

The third heating mechanism 215 is disposed in the lower portion inside the reflow furnaces 212*a* and 212*b* and under the transfer mechanism 211. The third heating mechanism 215 heats the reflow furnaces 212*a* and 212*b* from below. The third heating mechanism 215 includes a single-phase heater of 100 V, 15 A.

Further, there are provided first to fourth heat storage plates 236, 237, 238 and 239 to enclose the transfer mechanism 211 in the reflow furnaces 212*a* and 212*b* as shown in FIGS. 36 and 37. The first heat storage plate 236 is disposed between the first heating mechanism 213 and the printed wiring board 2 being carried by the transfer mechanism 211. The second heat storage plate 237 is disposed between the second heating mechanism 214 and the printed wiring board 2 being carried by the transfer mechanism 211. The third heat storage plate 238 is disposed above the third heating mechanism 215 under the reflow furnaces 212*a* and 212*b*. The fourth heat storage plate 239 is disposed opposite to the third heat storage plate 238 and near the ceiling of the reflow furnace unit 212. In the first to fourth heat storage plates 236 to 239, there are formed at regular intervals a plurality of through-holes 240*a*, 240*b*, 240*c* and 240*d*, respectively, to generate a convection of air heated by the first to third heating mechanisms 213, 214 and 215. Thus, since the first to fourth heat storage plates 236, 237, 238 and 239 are disposed in the reflow furnaces 212*a* and 212*b* to enclose the printed wiring board 2 supported by the transfer mechanism 211, the inside of the reflow furnaces 212*a* and 212*b* as a whole is evenly heated. For example, the pre-heating reflow furnace 212a provides a heating at 140° C. while the heating reflow furnace 212b provides a heating at 220 to 240° C.

Figure 38:
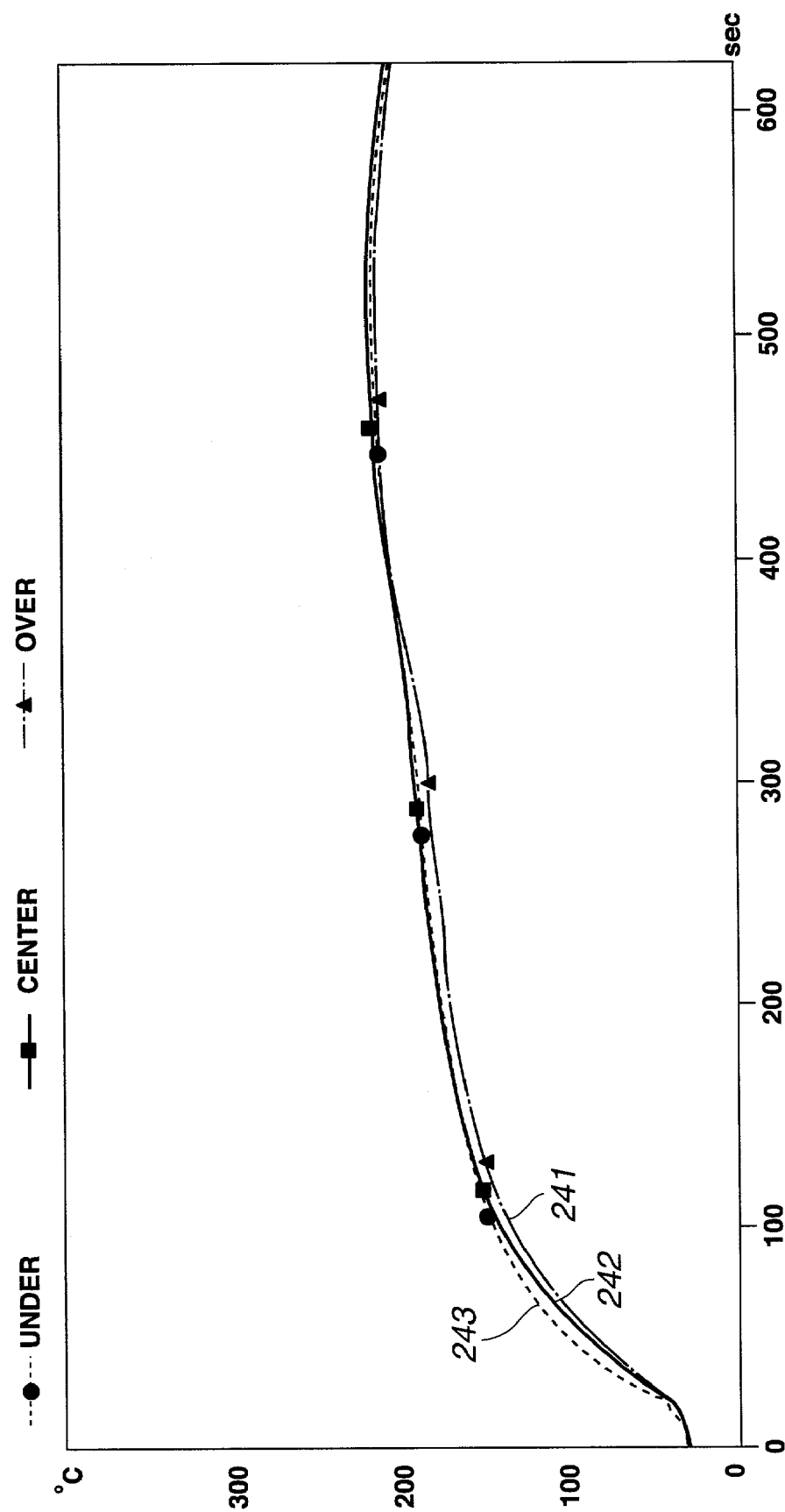
FIG. 38 is a characteristic diagram showing the thermal characteristic in the reflow furnace unit.

FIG. 38 shows the thermal characteristic found in the heating reflow furnace 212b. In FIG. 38, a dashed line 241 indicate the thermal characteristic in the upper portion of the reflow furnace 212b, a solid line 242 indicates the thermal characteristic in the middle of the reflow furnace 212b, and a broken line 243 indicates the thermal characteristic in the lower portion of the reflow furnace 212b. In case the first to third heating mechanisms 213, 214 and 215 are disposed and the first to fourth heat storage plates 236 to 239 are disposed to enclose the transfer mechanism 211 as in the above, the temperature in the reflow furnace 212b can be nearly the same in all the upper, middle and lower portions of the reflow furnace 212b as will be seen from FIG. 38. For example, the temperature difference among these portions can be less than about 4° C.

As shown in FIG. 35, an exhaust hood 244 is provided on the ceilings of the reflow furnaces 212a and 212b. The exhaust hood 244 is connected by connection tubes 245 to the pre-heating reflow furnace 212a, and by connection tubes 246 to the heating reflow furnace 212b. The exhaust hood 244 has an exhaust duct 247 as shown in FIG. 35. Air exhausted from inside the reflow furnaces 212a and 212b is accumulated once in the exhaust hood 244, and then exhausted from the exhaust duct 247, thereby permitting to prevent the temperature in the reflow furnaces 212a and 212b from being lower.

Figure 39:
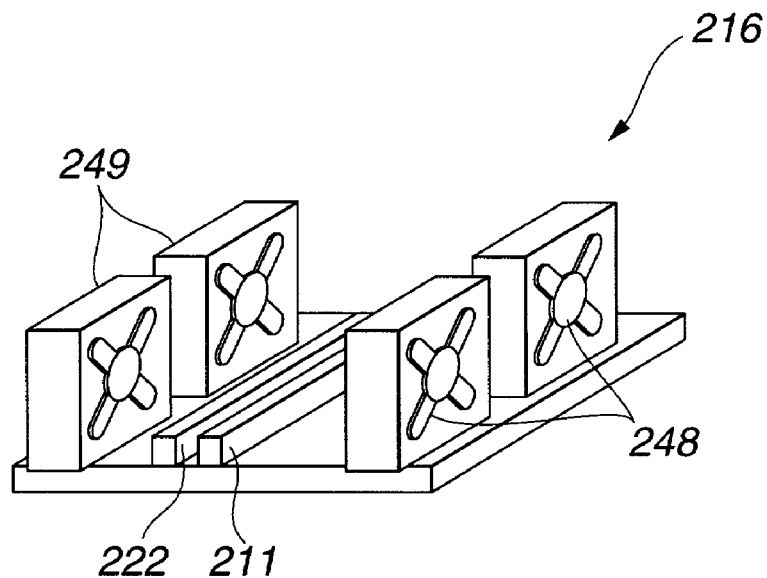
FIG. 39 is a perspective view of the cooling block.

As shown in FIG. 39, there is provided downstream of the heating reflow furnace 212b the cooling block 216 to cool the melted solder. In the cooling block 216, cooling fans 248 are disposed to face one side of the printed wiring board 2 supported in nearly upright position by the transfer mechanism 211, and cooling fans 249 are disposed to face the other side of the printed wiring board 2. The cooling fans 248 and 249 are disposed to face the main sides, respectively, of the printed wiring board 2 being carried while being support in generally upright position by the transfer mechanisms 121a to 121d, and so the melted solder on each main side of the printed wiring board 2 can be cooled and solidified with a high efficiency.

Figure 40:
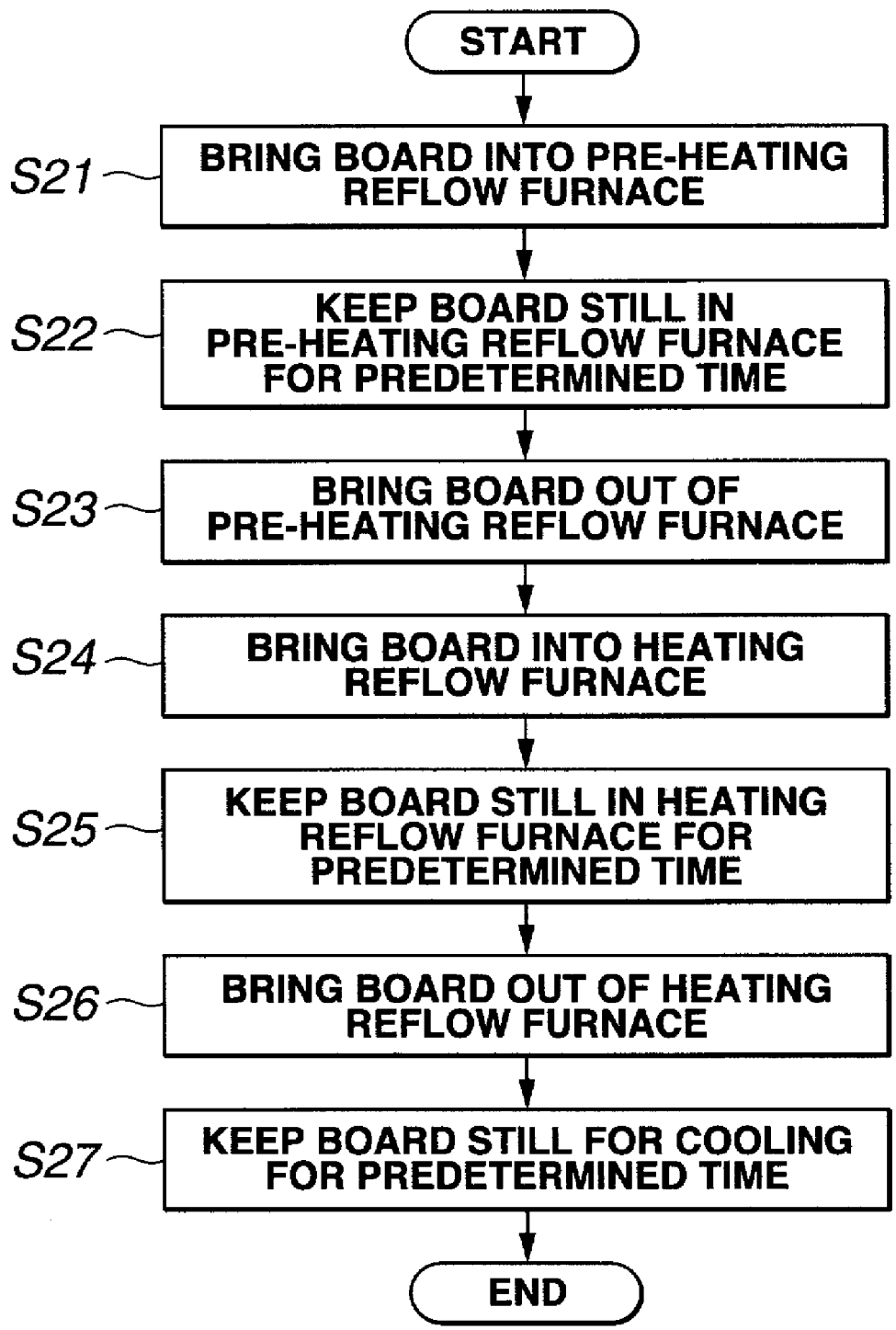
FIG. 40 shows a flow of operations of the reflow unit.
Figure 41:
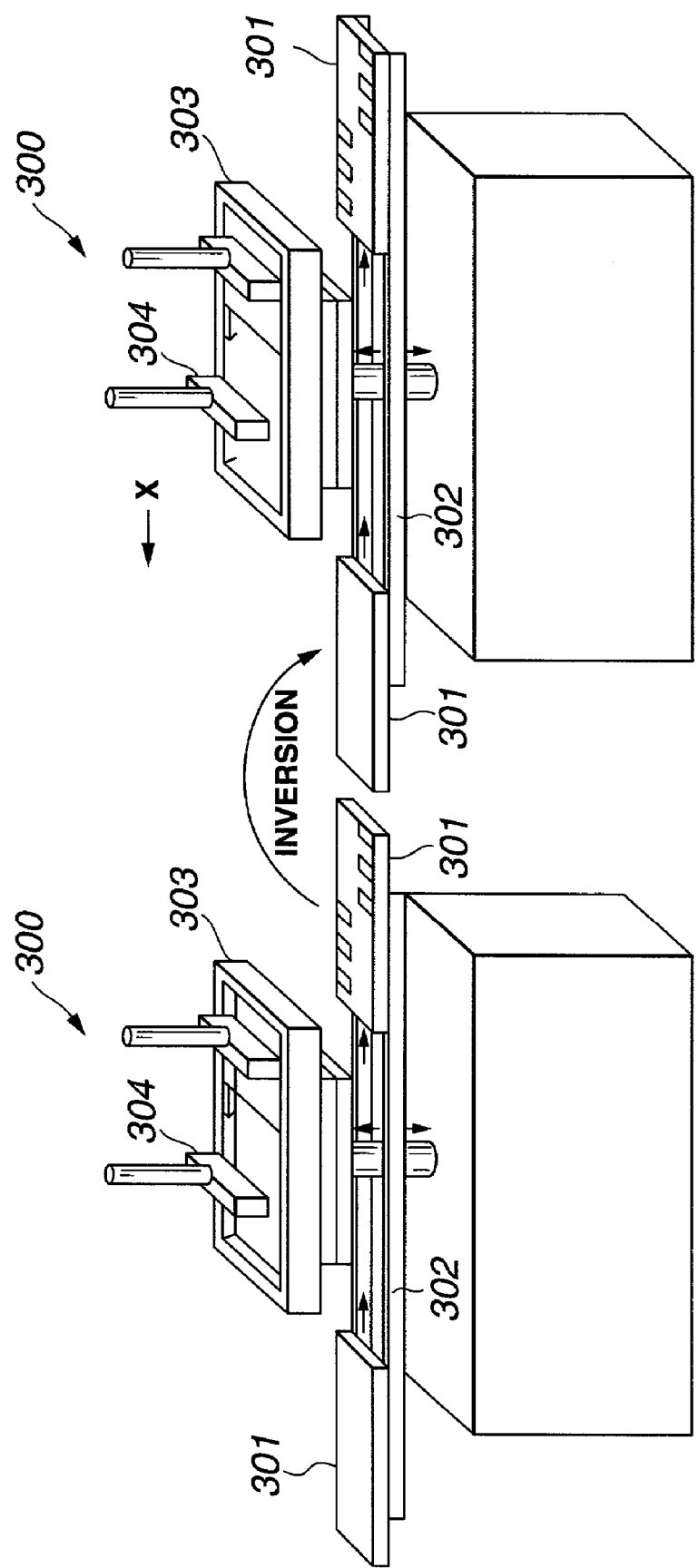
FIG. 41 is a perspective view of the conventional printer.
Figure 42:
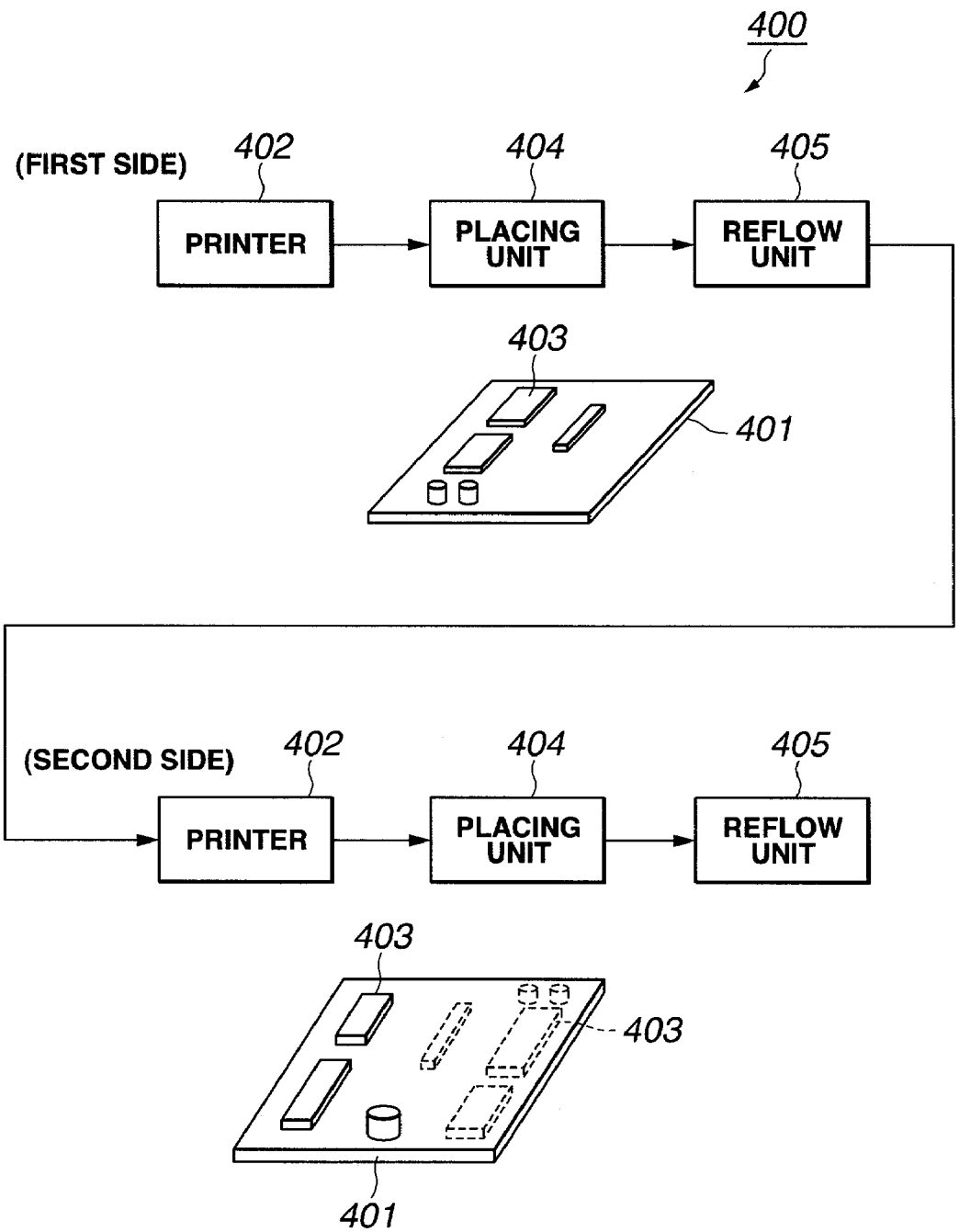
FIG. 42 is a block diagram of a conventional electronics packaging system.

The printer 3 constructed as in the above functions as will be described below with reference to FIG. 40. Before the printed wiring board 2 having the electronic parts 10 and 10a placed thereon by the placing unit 4 is introduced into the transfer mechanism 211, the carrying member 224 has been moved in the direction opposite to the direction of arrow N in FIG. 36 and the carrying pin 225 has been moved by the cylinder mechanism 227 in the direction opposite to the direction of arrow O in FIG. 36. In step S21, the printed wiring board 2 is introduced into the transfer mechanism 211. The printed wiring board 2 is engaged at the edge thereof engaged in the guide recess 222 in the guide member 221. The carrying pin 225 is moved by the cylinder mechanism 227 in the direction of arrow O in FIG. 36 and engaged into the engagement hole 6b in the printed wiring board 2. The driving mechanism 229 is put into action to cause the endless belt 232 to run. Thus the printed wiring board 2 is moved by the carrying member 224 in the direction of arrow N in FIG. 36 while being guided on the rail 234 on the guide member 233 into the pre-heating reflow furnace 212a. In step S22, the printed wiring board 2 having the electronic parts 10 and 10a placed thereon is left stopped inside the pre-heating reflow furnace 212a for a predetermined length of time and thus the cream solder printed on the lands of the printed wiring board 2 is semi-melted.

When the cream solder is semi-melted, the printed wiring board 2 is carried by the carrying member 244 out of the pre-heating reflow furnace 212a in step S23 and carried into the heating reflow furnace 212b in step S24. Next in step S25, the printed wiring board 2 having the electronic parts 10 and 10a placed thereon with the cream solder being semi-melted is left stopped for a predetermined length of time in the heating reflow furnace 212b and thus the semi-melted cream solder is completely melted. Thereafter, in step S26, the printed wiring board 2 is brought out by the carrying member 244 from the heating reflow furnace 212b and then brought into the A cooling block 216 in step S27. In this step S27, the melted cream solder is cooled and solidified in the cooling block 216, and thus the electronic parts 10 and 10a are soldered to the printed wiring board 2. Thereafter, the printed wiring board 2 is carried by the transfer mechanisms 211 to an outlet position where the carrying pin 225 is moved by the cylinder mechanism 227 in the direction opposite to the direction of arrow O in FIG. 36, disengaged from the engagement hole 6b and brought out by the transfer mechanism 211.

In the above reflow unit 5, since the printed wiring board 2 is supported in upright position by the transfer mechanism 211, so the electronic parts 10 and 10a placed on either side of the printed wiring board 2 can be soldered to the latter at the same time. Therefore, the reflow unit 5 dedicates very much to a reduced time for mounting of the electronic parts 10 and 10a, and also to a smaller scale of the electronics packaging system than the conventional system in which electronic parts are soldered on each side of a printed wiring board in one pass. Also, since in the reflow furnaces 212a and 212b of the reflow unit 5, the first to fourth heat storage plates 236, 237, 238 and 239 are disposed to enclosed the printed wiring board 2 supported by the transfer mechanism 211, so the printed wiring board 2 can be heated evenly by the reflow furnaces 212a and 212b. Further, since in the reflow unit 5, the exhaust hood 244 exhausts air from inside the reflow furnaces 212a and 212b, so it is possible to prevent the temperature in the reflow furnaces 212a dnd 212b from being lower.

As having been described in the foregoing, the electronics packaging system 1 according to the present invention includes the printer 3, placing unit 4 disposed downstream of the printer 3, and the reflow unit 5 disposed downstream of the placing unit 4. In the electronics packaging system 1, there are provided the transfer mechanism 11 to carry the printed wiring board 2 while keeping it in generally upright position to the printer 3, the transfer mechanisms 121a to 121d to carry the printed wiring board 2 while keeping it in the generally upright position also to the placing unit 4 provided downstream of the printer 3, and the transfer mechanism 211 to carry the printed wiring board while keeping it in the generally upright position also to the reflow unit 5 provided downstream of the placing unit 4. Thus, the transfer mechanisms 11, 121a to 121d and 211 are disposed contiguously to each other. That is, in the packaging system 1, the printed wiring board 2 is carried through the printer 3, placing unit 4 and reflow unit 5 while being kept in the generally upright position. The printer 3 has the screen mechanisms 12 provided across the printed wiring board 2 supported by the transfer mechanism 11. The placing unit 4 has the placing mechanisms 122a to 122h provided across the printed wiring board 2 supported in the transfer mechanisms 121a to 121d. Further, the reflow unit 5 has the placing mechanisms 122a to 122h provided across the printed wiring board 2 supported by the transfer mechanisms 121a to 121d. Thus, in the electronics packaging system 1, the cream solder can be printed by the printer 3 on the land on either side of the printed wiring board at the same time, next the electronic parts 10 and 10a can be placed by the placing unit 4 on either side of the printed wiring board 2 at the same time, and then the electronic parts 10 and 10a placed on either side of the printed wiring board 2 can be soldered by the reflow unit 5 to the printed wiring board 2 at the same time. Therefore, the packaging system 1 can be designed to a size taking only a half of the space occupied by the conventional system in which cream solder is printed on each side of a printed wiring board and electronic parts are placed on, and soldered, to each side of the printed wiring boards in one pass, and can also dedicate to an improved efficiency of production.

As shown in FIG. 18, in the placing unit 4, land-position data generated by the controller 15 of the printer 3 is supplied to the controller 123a for the placing mechanisms 122a and 122b via the system controller 124, and then the land-position data supplied to the controller 123a is sequentially supplied to the controllers 123b to 123d, to thereby control the placing mechanisms 122a to 122h. Thus, no mechanism to detect land positions may be provided for the placing mechanisms 121a to 121d, which will further dedicate to a simplification of the system.

INDUSTRIAL APPLICABILITY

As having been described in the foregoing, the electronics packaging system according to the present invention carries a printed wiring board on which electronic parts are to be mounted while being held in generally upright position, which makes it possible to printed solder on the land on either side of the printed wiring board at the same time, place the electronic parts on the lands at the same time and solder the electronic parts to the printed wiring board at the same. Thus, the entire system can be desired more compact and electronic parts can be mounted with a higher efficiency.

What is claimed is:

1. An electronics packaging system comprising:
a printer to print solder on lands of a printed wiring board;
a placing unit to place electronic parts on the lands of the printed wiring board having the solder printed thereon by the printer;
a reflow unit to heat the printed wiring board on which the electronic parts have been placed by the placing unit and to solder the electronic parts to the printed wiring board; and
a transfer mechanism, to transfer the printed wiring board to the printer and through the printer to the placing unit and through the placing unit to the reflow unit, wherein the transfer mechanism includes horizontal upper and lower guide rails for capturing upper and lower edges of the printed wiring board and being attached to vertical support members, whereby the printed wiring board is maintained in a generally upright position through the printer, the placing unit and the reflow unit.

2. The system according to claim 1, wherein:
land-position information is generated by a detecting mechanism provided in the printer before the solder is printed by the printer on the lands of the printed wiring board; and
the placing unit places the electronic parts on the printed wiring board based on the land-position information.

* * * * *